US012469798B2

(12) United States Patent
Cheng et al.

(10) Patent No.: US 12,469,798 B2
(45) Date of Patent: Nov. 11, 2025

(54) LAYOUT TO REDUCE NOISE IN SEMICONDUCTOR DEVICES

(71) Applicant: Taiwan Semiconductor Manufacturing Company, Ltd., Hsin-Chu (TW)

(72) Inventors: Chih-Chang Cheng, Hsinchu (TW); Fu-Yu Chu, Hsinchu (TW); Ruey-Hsin Liu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 174 days.

(21) Appl. No.: 18/363,966

(22) Filed: Aug. 2, 2023

(65) Prior Publication Data

US 2023/0378090 A1   Nov. 23, 2023

Related U.S. Application Data

(63) Continuation of application No. 17/388,437, filed on Jul. 29, 2021, now Pat. No. 11,817,396, which is a
(Continued)

(51) Int. Cl.
*H01L 21/28*        (2025.01)
*H01L 21/285*       (2006.01)
(Continued)

(52) U.S. Cl.
CPC ...... *H01L 23/552* (2013.01); *H01L 21/28518* (2013.01); *H01L 21/762* (2013.01); *H10D 30/021* (2025.01); *H10D 30/60* (2025.01)

(58) Field of Classification Search
CPC ............ H01L 21/28518; H01L 21/762; H01L 23/552; H01L 21/76224; H10D 30/021;
(Continued)

(56) References Cited

U.S. PATENT DOCUMENTS 8,716,768 B2    5/2014  Lyu et al.
9,190,536 B1   11/2015  Chan et al.
(Continued)

OTHER PUBLICATIONS

U.S. Appl. No. 15/800,474, filed Nov. 1, 2017.
(Continued)

*Primary Examiner* — Monica D Harrison
(74) *Attorney, Agent, or Firm* — Eschweiler & Potashnik, LLC

(57) ABSTRACT

In some embodiments, a semiconductor device is provided. The semiconductor device includes an isolation structure disposed in a semiconductor substrate, where an inner perimeter of the isolation structure demarcates a device region of the semiconductor substrate. A gate is disposed over the device region, where an outer perimeter of the gate is disposed within the inner perimeter of the isolation structure. A first source/drain region is disposed in the device region and on a first side of the gate. A second source/drain region is disposed in the device region and on a second side of the gate opposite the first side. A silicide blocking structure partially covers the gate, partially covers the first source/drain region, and partially covers the isolation structure, where a first sidewall of the silicide blocking structure is disposed between first opposite sidewalls of the gate.

20 Claims, 17 Drawing Sheets

Related U.S. Application Data continuation of application No. 16/924,627, filed on Jul. 9, 2020, now Pat. No. 11,088,085, which is a continuation of application No. 16/363,114, filed on Mar. 25, 2019, now Pat. No. 10,714,432.

(51) Int. Cl.
| | | |
|---|---|---|
| *H01L 21/76* | (2006.01) | |
| *H01L 21/762* | (2006.01) | |
| *H01L 23/552* | (2006.01) | |
| *H10D 30/01* | (2025.01) | |
| *H10D 30/60* | (2025.01) | |

(58) Field of Classification Search
CPC .. H10D 30/60; H10D 30/0223; H10D 64/519; H10D 30/80; H10D 86/00; H10D 86/01; H10D 86/201
USPC ............................................................ 257/288
See application file for complete search history.

(56) References Cited

U.S. PATENT DOCUMENTS

| | | | |
|---|---|---|---|
| 9,917,212 | B1 | 3/2018 | Chu et al. |
| 10,164,033 | B2 | 12/2018 | Yeo et al. |
| 11,088,085 | B2 | 8/2021 | Cheng et al. |
| 2002/0079556 | A1 | 6/2002 | Ishikura et al. |
| 2006/0071304 | A1 | 4/2006 | Jagannathan et al. |
| 2006/0192258 | A1 | 8/2006 | Tsuchiya et al. |
| 2008/0026515 | A1 | 1/2008 | El-Kareh et al. |
| 2009/0224335 | A1 | 9/2009 | Chang |
| 2010/0315115 | A1 | 12/2010 | Lee et al. |
| 2012/0074498 | A1 | 3/2012 | Chuang |
| 2013/0009217 | A1* | 1/2013 | Yin .................... H01L 21/28518 257/E21.409 |
| 2013/0154023 | A1 | 6/2013 | Yoshida et al. |
| 2013/0334614 | A1 | 12/2013 | Liaw |
| 2014/0042506 | A1 | 2/2014 | Ramberg et al. |
| 2015/0200249 | A1 | 7/2015 | Kundu |
| 2017/0235795 | A1 | 8/2017 | Gilder |
| 2017/0294356 | A1 | 10/2017 | Yeh et al. |
| 2018/0166545 | A1 | 6/2018 | Wang et al. |
| 2019/0067138 | A1 | 2/2019 | Lo et al. |
| 2019/0088780 | A1 | 3/2019 | Choi et al. |

OTHER PUBLICATIONS

Kwon, et al. "Effects of Shallow Trench Isolation on Low Frequency Noise Characteristics of Source-Follower Transistors in CMOS Image Sensors." Solid-State Electronics 119 (2016) 29-32, published Mar. 1, 2016.
Chan, et al. "STI Effect on Flicker Noise in 0.13-µm RF NMOS." Proceeding of the 36th European IEEE Solid-State Device Research Conference, 2006. ESSDERC 2006. Published Feb. 12, 2007.
Non-Final Office Action dated Jun. 2, 2017 for U.S. Appl. No. 15/257,291.
Notice of Allowance dated Nov. 3, 2017 for U.S. Appl. No. 15/257,291.
Non-Final Office Action dated Jul. 10, 2018 for U.S. Appl. No. 15/688,018.
Final Office Action dated Jan. 30, 2019 for U.S. Appl. No. 15/688,018.
Carmonai, M, Hubert, L. Lopezi, F. Julieni, J., Ogieri, D. Goguenheim, and L. Beauvisagei Study of gate contact over active area, 2014 29th Symposium on Microelectronics Technology and Devices (SBMicro), Aracaju, 2014, pp. 1-4. (Year: 2014).
Non-Final Office Action dated Aug. 20, 2019 in connection with U.S. Appl. No. 15/688,018.
Non-Final Office Action dated Oct. 24, 2019 in connection with U.S. Appl. No. 15/800,474.
Notice of Allowance dated Jan. 15, 2020 in connection with U.S. Appl. No. 15/800,474.
Notice of Allowance dated Feb. 13, 2020 in connection with U.S. Appl. No. 15/688,018.
Notice of Allowance dated Mar. 9, 2020 in connection with U.S. Appl. No. 16/363,114.
Non-Final Office Action dated Jan. 21, 2021 in connection with U.S. Appl. No. 16/837,401.
Notice of Allowance dated Jan. 22, 2021 in connection with U.S. Appl. No. 16/837,444.
Non-Final Office Action dated Feb. 2, 2021 for U.S. Appl. No. 16/924,627.
Notice of Allowance dated Apr. 9, 2021 for U.S. Appl. No. 16/924,627.
Non-Final Office Action dated Apr. 25, 2023 for U.S. Appl. No. 17/388,437.
Notice of Allowance dated Jul. 13, 2023 for U.S. Appl. No. 17/388,437.

\* cited by examiner

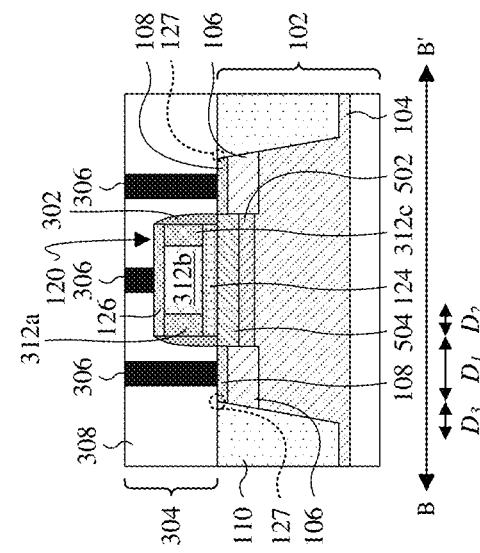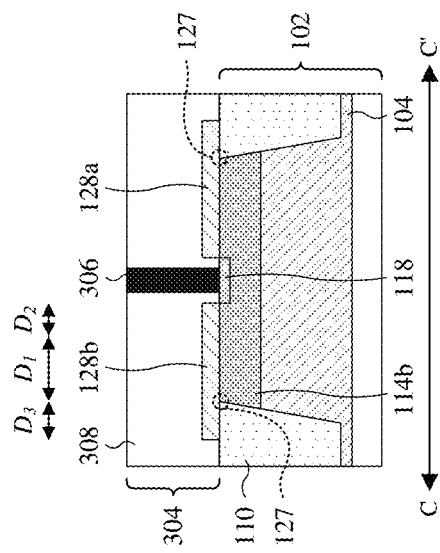
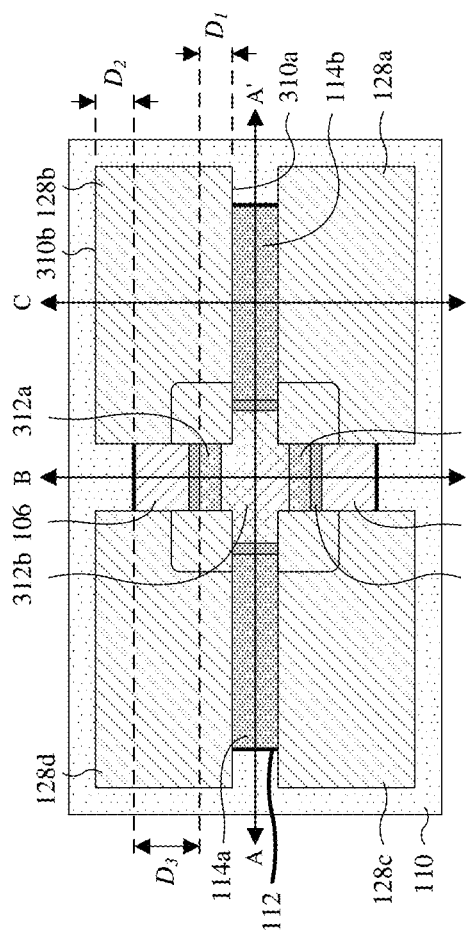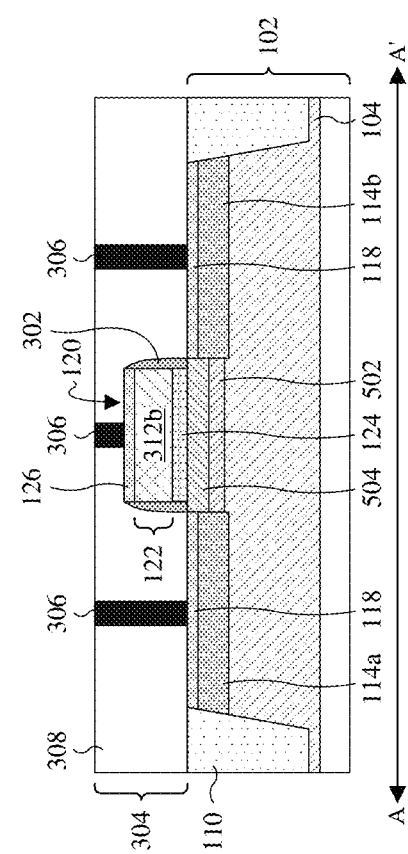
Fig. 5A
Fig. 5C
Fig. 5B
Fig. 5D

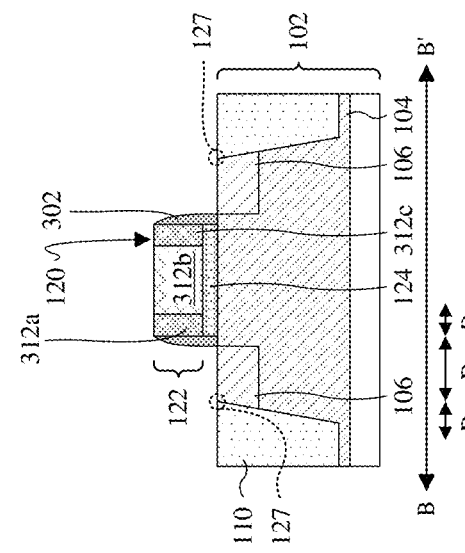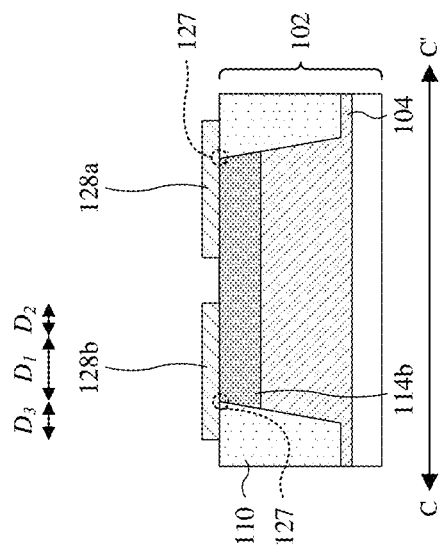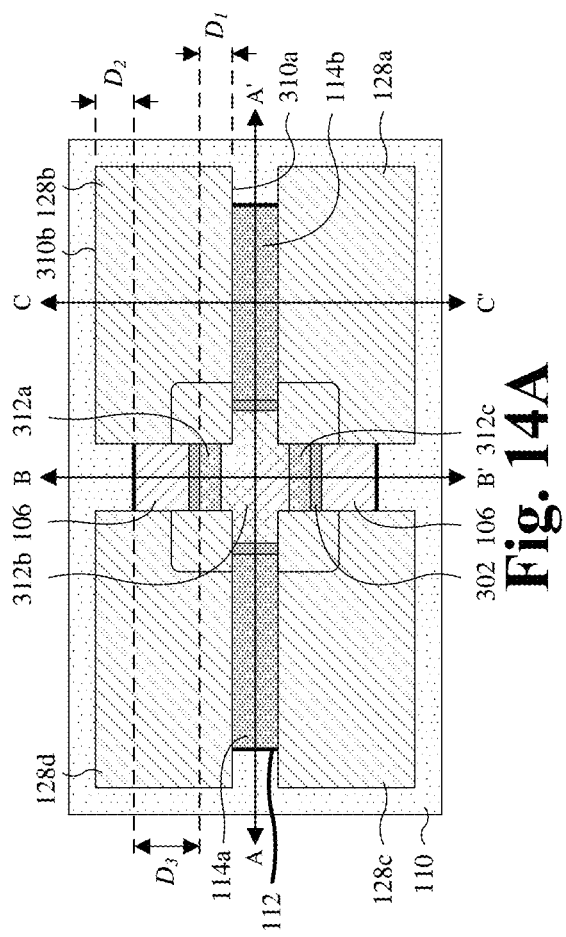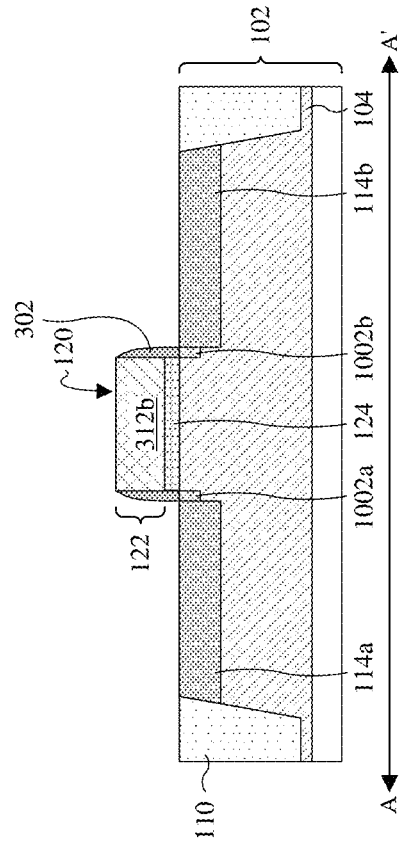

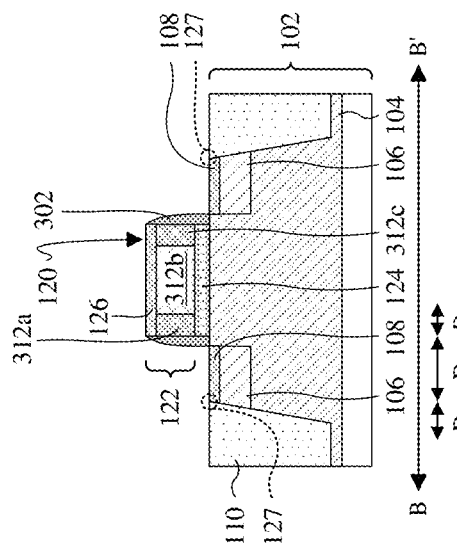
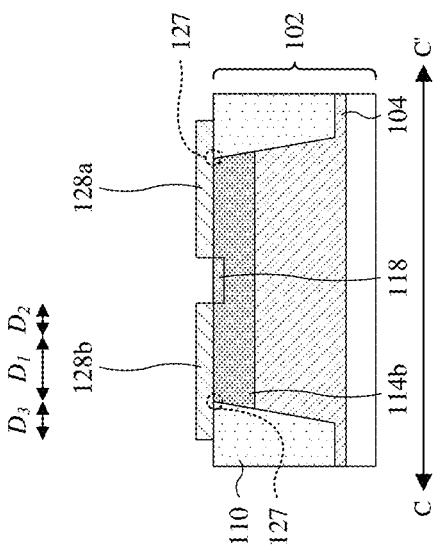
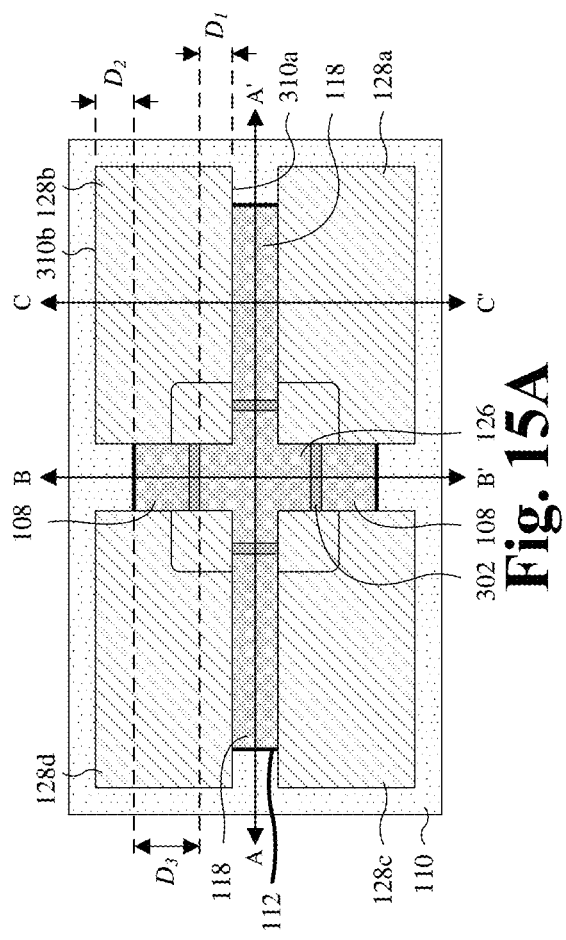
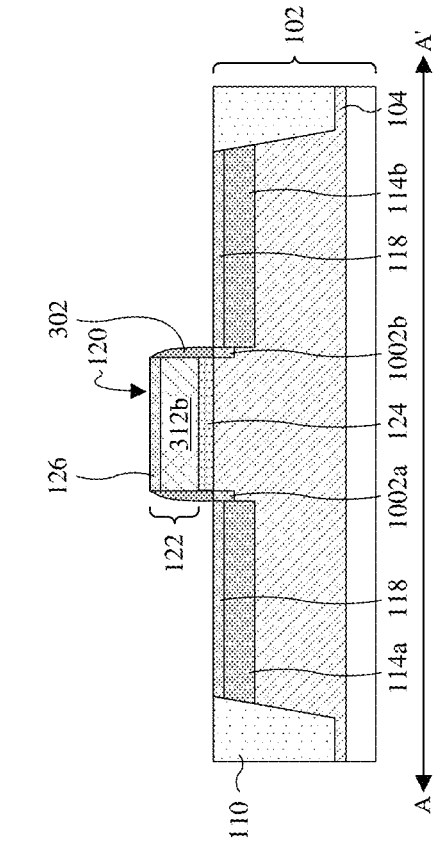

LAYOUT TO REDUCE NOISE IN SEMICONDUCTOR DEVICES

REFERENCE TO RELATED APPLICATIONS

This application is a Continuation of U.S. application Ser. No. 17/388,437, filed on Jul. 29, 2021, which is a Continuation of U.S. application Ser. No. 16/924,627, filed on Jul. 9, 2020, (now U.S. Pat. No. 11,088,085, issued on Aug. 10, 2021), which is a Continuation of U.S. application Ser. No. 16/363,114, filed on Mar. 25, 2019 (now U.S. Pat. No. 10,714,432, issued on Jul. 14, 2020). The contents of the above-referenced Patent Applications are herby incorporated by reference in their entirety.

BACKGROUND

Semiconductor devices are electronic components that exploit electronic properties of semiconductor materials to affect electrons or their associated fields. A widely used type of semiconductor device is a field-effect transistor (FET). A FET comprises a pair of source/drain regions, a selectively-conductive channel, and a gate electrode. FETs are versatile devices that may be used for, among other things, switches, amplifiers, and memory. Examples of FETs include metal-oxide-semiconductor field-effect transistors (MOSFETs) and junction gate field-effect transistors (JFETs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5D illustrate various views of other embodiments of the FET of FIGS. 3A-3D.

DETAILED DESCRIPTION

Figure 1A:
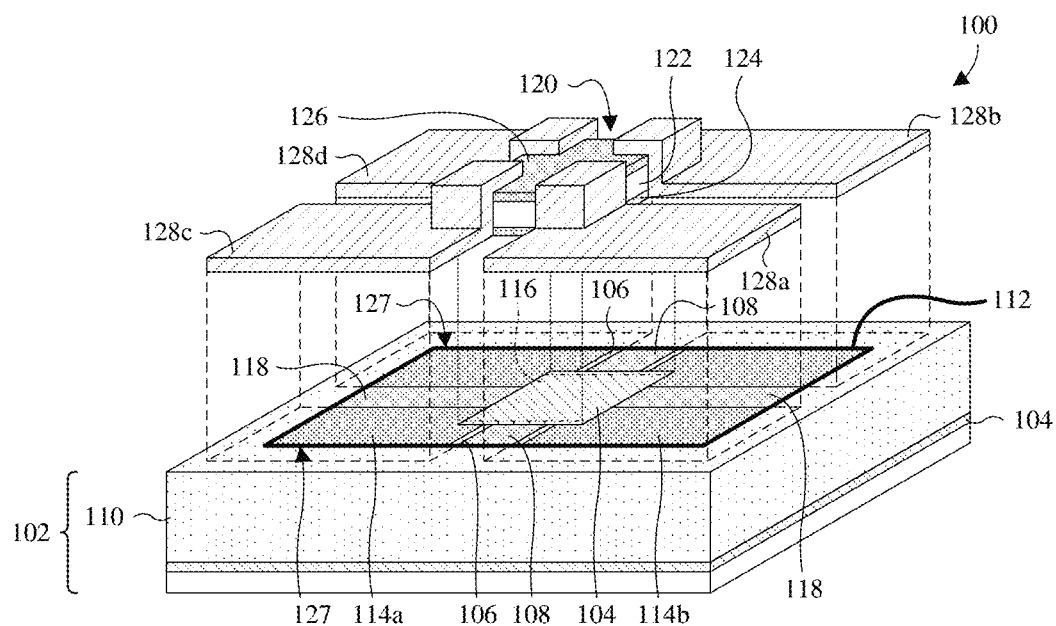
FIGS. 1A-1C illustrate various perspective views of some embodiments of a field-effect transistor (FET) with low flicker noise and low random telegraph noise (RTN).

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some field-effect transistors (FETs) comprise a semiconductor substrate and a shallow trench isolation (STI) structure. The STI structure is disposed in the semiconductor substrate and demarcates a device region of the semiconductor substrate. Further, the FET comprises a pair of source/drain regions, a selectively-conductive channel, a gate dielectric, and a gate electrode. The source/drain regions are disposed in the device region and laterally spaced. The selectively-conductive channel is disposed in the device region and extends from one of the source/drain regions to another one of the source/drain regions. The gate dielectric overlies the selectively-conductive channel, and the gate electrode overlies the gate dielectric layer.

A challenge with the above FETs is flicker noise and random telegraph noise (RTN). One source of flicker noise and RTN is due to defect states at a pair of STI corners. The STI corners are top cross-sectional corners of the semiconductor substrate that are in the device region and interface with the STI structure. Further, the STI corners are respectively on opposite sides of the selectively-conductive channel, and each extends laterally along a length of the selectively-conductive channel from one of the source/drain regions to another one of the source/drain regions. The STI corners have a high amount of defect states because the STI corners have high mechanical stress and are not defined by perfectly planar surfaces. Further, electric fields are strong at the STI corners because the STI corners have small radiuses of curvature. Accordingly, as current flows through the selectively-conductive channel, charge carriers are trapped and de-trapped by the defect states, thereby generating the flicker noise and RTN.

A partial solution to the challenge is to move the source/drain regions from the STI corners by using the gate electrode as a mask. For example, the gate electrode is formed over the device region and over the STI corners. The gate electrode is formed with a pair of source/drain openings that overlap the device region and that are spaced from the STI corners. With the gate electrode in place, an ion implantation process is performed to form the source/drain regions in the semiconductor substrate and spaced from the STI corners. By spacing the source/drain regions from the STI corners, current flow along the STI corners may be reduced, thereby reducing flicker noise and RTN generated at the STI corners. However, although the source/drain regions are spaced from the STI corners, as a voltage is applied to the gate to cause a current to flow through the selectively-conductive channel, charge carriers may still be trapped and de-trapped by the defect states at the STI corners due to the gate electrode overlapping the STI corners (e.g., causing an inversion region to form near/along the STI corners). In addition, by using the gate electrode to move the source/drain regions from the STI corners, a subsequent silicide formation process (e.g., a salicide process) may form a silicide layer the short circuits the FET (e.g., the silicide layer coupling the source/drain regions together).

Various embodiments of the present application are directed toward a semiconductor device having low flicker noise and low RTN. For example, the semiconductor device may comprise an isolation structure (e.g., STI structure) disposed in a semiconductor substrate, where an inner perimeter of the isolation structure defines a device region of the semiconductor substrate. A gate is disposed over the device region, and an outer perimeter of the gate is disposed within the inner perimeter of the isolation structure. A first source/drain region is disposed in the device region and on a first side of the gate. A second source/drain region is disposed in the device region on a second side of the gate opposite the first side. A silicide blocking structure partially covers the gate, partially covers the first source/drain region, and partially covers the isolation structure.

Because the perimeter of the gate is disposed within the inner perimeter of the isolation structure, the gate does not overlap the STI corners. Thus, during operation of the semiconductor device (e.g., when a voltage is applied to the gate to cause a current to flow through the selectively-conductive channel), charge carriers may not be trapped and de-trapped by defect states at the STI corners, thereby reducing flicker noise and RTN. Further, because the silicide blocking structure partially covers the gate, partially covers the first source/drain region, and partially covers the isolation structure, the silicide blocking structure may prevent a silicide process from forming a silicide layer that short circuits the semiconductor device.

Figure 1B:
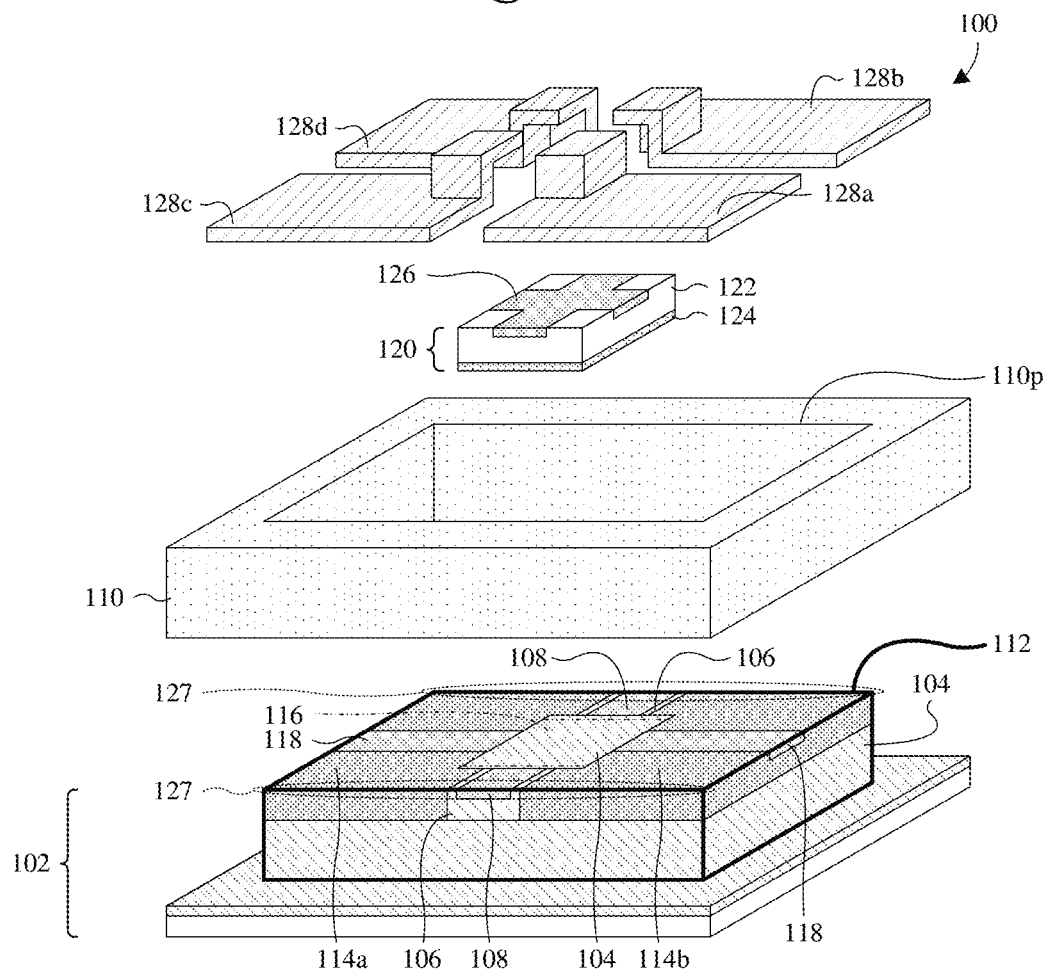
Figure 1C:
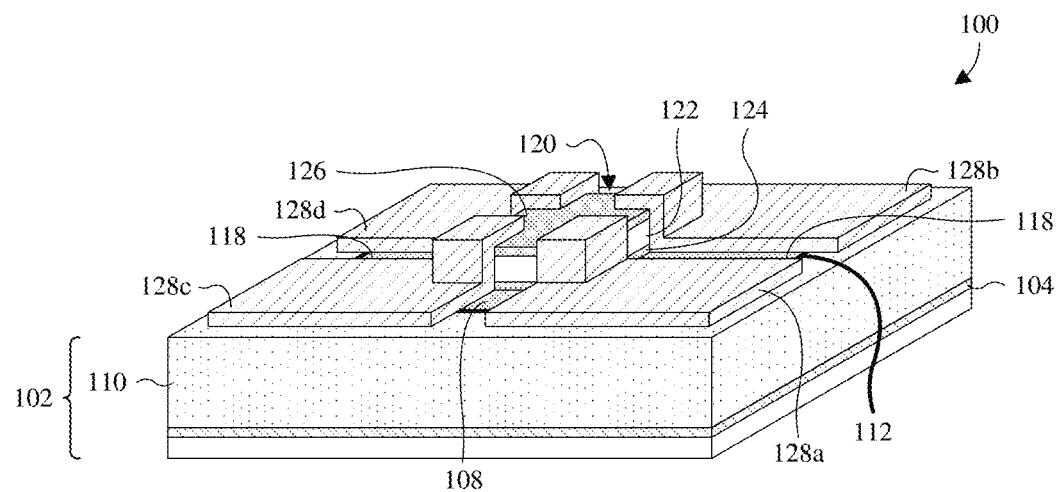

FIGS. 1A-1C illustrate various perspective views of some embodiments of a field-effect transistor (FET) 100 with low flicker noise and low random telegraph noise (RTN). FIG. 1A is a deconstructed perspective view of the FET of FIGS. 1B-1C. FIG. 1B is a deconstructed perspective view of the FET of FIGS. 1A and 1C. FIG. 1C is a constructed perspective view of the FET of FIGS. 1A-1B.

FIG. 1A is "deconstructed" in that a gate 120 and a plurality of silicide blocking structures 128*a-d* are separated from a semiconductor substrate 102 and an isolation structure 110 in which the gate 120 and the plurality of silicide blocking structures 128*a-d* are normally disposed on/over. FIG. 1B is "deconstructed" in the same manner as FIG. 1A, except the isolation structure 110 is further separated from the semiconductor substrate 102 in which it normally is disposed on/in, and the plurality of silicide blocking structures 128*a-d* are further separated from the gate 120 in which they normally are disposed on/over. FIG. 1C is "constructed" in that the gate 120 and the plurality of silicide blocking structures 128*a-d* are disposed in their normal positions. The FET may be, for example, a metal-oxide-semiconductor field-effect transistor (MOSFET), a junction gate field-effect transistor (JFET), or some other type of field-effect transistor.

As shown in FIGS. 1A-1C, the FET 100 comprises a semiconductor substrate 102. In some embodiments, the semiconductor substrate 102 comprises any type of semiconductor body (e.g., monocrystalline silicon/CMOS bulk, silicon-germanium (SiGe), silicon on insulator (SOI), etc.). In further embodiments, a first well 104 is disposed in the semiconductor substrate 102. The first well 104 is a region of the semiconductor substrate 102 having a first doping type (e.g., n-type). In yet further embodiments, the first well 104 has a first concentration of first dopants (e.g., n-type dopants).

In some embodiments, a pair of well pickup regions 106 are disposed in the first well 104. The well pickup regions 106 are regions of the semiconductor substrate 102 having a same doping type as the first well 104. In some embodiments, the well pickup regions 106 have a second concentration of the first dopants that is greater than the first concentration. In yet further embodiments, a pair of first silicide layers 108 are disposed on/in the pair of well pickup regions 106, respectively. The first silicide layers 108 may comprise, for example, nickel (e.g., nickel silicide), titanium (e.g., titanium silicide), cobalt (e.g., cobalt silicide), platinum (e.g., platinum silicide), tungsten (e.g., tungsten silicide), or the like.

An isolation structure 110 is disposed in the semiconductor substrate 102. An inner perimeter 110*p* of the isolation structure 110 defines a device region 112 of the semiconductor substrate 102. In some embodiments, the isolation structure 110 may comprise a dielectric structure composed of a dielectric material (e.g., silicon dioxide ($SiO_2$)). In further embodiments, the isolation structure 110 may be, for example, a shallow trench isolation (STI) structure, a deep trench isolation (DTI) structure, or some other isolation structure. In further embodiments, the isolation structure 110 has a ring-shaped layout that laterally surrounds the device region 112. It will be appreciated that the ring-shaped layout is not limited to shape in which an inner or outer perimeter is circular. Instead, the inner or outer perimeter of the ring-shaped layout may comprise any geometrical shape(s) (e.g., square, rectangular, elliptical, etc.) that when considered together have a generally ring-shaped layout.

A first source/drain region 114*a* and a second source/drain region 114*b* are disposed in the device region 112. The first source/drain region 114*a* is laterally spaced from the second source/drain region 114*b*. A selectively-conductive channel 116 is disposed in the device region 112 and extends from the first source/drain region 114*a* to the second source/drain region 114*b*. In some embodiments, the selectively-conductive channel 116 is a region of the first well 104 and provides a channel for electrons (or electron holes) to flow between the first source/drain region 114*a* and the second source/drain region 114*b*. In further embodiments, the first source/drain region 114*a* is a first region of the semiconductor substrate 102 having a second doping type (e.g., p-type) that is different than the first doping type, and the second source/drain region 114*b* is a second region of the semiconductor substrate 102 having the second doping type.

In some embodiments, a pair of second silicide layers 118 are disposed on/in the first source/drain region 114*a* and the second source/drain region 114*b*, respectively. For example, one of the second silicide layers of the pair of second silicide layers 118 is disposed on the first source/drain region 114*a*, and another one of the second silicide layers of the pair of second silicide layers 118 is disposed on the second source/drain region 114b. The second silicide layers 118 may comprise, for example, nickel (e.g., nickel silicide), titanium (e.g., titanium silicide), cobalt (e.g., cobalt silicide), platinum (e.g., platinum silicide), tungsten (e.g., tungsten silicide), or the like.

A gate 120 is disposed over the semiconductor substrate 102 and the device region 112. The gate 120 comprises a gate electrode 122 disposed on a gate dielectric 124. The gate electrode 122 may comprise, for example, doped polysilicon, a metal (e.g., tungsten, aluminum, etc.), a silicide (e.g., titanium silicide, nickel silicide, etc.), or some other conductive material. The gate dielectric 124 may comprise, for example, an oxide (e.g., $SiO_2$), a high-k dielectric (e.g., a dielectric material having a dielectric constant greater than 3.9), or some other dielectric material. In some embodiments, the gate 120 comprises a third silicide layer 126 disposed on/in the gate electrode 122. In further embodiments, the third silicide layer 126 may comprise, for example, nickel (e.g., nickel silicide), titanium (e.g., titanium silicide), cobalt (e.g., cobalt silicide), platinum (e.g., platinum silicide), tungsten (e.g., tungsten silicide), or the like.

In some embodiments, an outer perimeter of the gate 120 is disposed within the inner perimeter 110p of the isolation structure 110. Because an outer perimeter of the gate 120 is disposed within the inner perimeter 110p of the isolation structure 110, the gate 120 does not overlap a pair of isolation corners 127. The isolation corners 127 are top cross-sectional corners of the semiconductor substrate 102 that are disposed in the device region 112 and interface with the isolation structure 110. In some embodiments, the isolation corners 127 are line shaped and extend laterally in parallel with the selectively-conductive channel 116, from a first end of the device region 112 to a second end of the device region 112 opposite the first end.

Because the gate 120 does not overlap the pair of isolation corners 127, flicker noise and RTN of the FET 100 may be reduced. For example, because the gate 120 does not overlap the pair of isolation corners 127, during operation of the FET (e.g., when a voltage is applied to the gate electrode 122 to cause current to flow through the selectively-conductive channel 116), the gate 120 may not form an inversion region near/along the isolation corners 127. This, in turn, reduces charge carriers from being trapped and de-trapped at the isolation corners 127, thereby resulting in the FET 100 having low flicker noise and low RTN.

Further, a plurality of silicide blocking structures 128a-d are disposed over the semiconductor substrate 102, the gate 120, and the isolation structure 110. For example, a first silicide blocking structure 128a, a second silicide blocking structure 128b, a third silicide blocking structure 128c, and a fourth silicide blocking structure 128d are disposed over the semiconductor substrate 102, the gate 120, and the isolation structure 110. The plurality of silicide blocking structures 128a-d are configured to prevent a silicide process (e.g., a salicide process) from forming a silicide layer on an underlying portion of the FET 100. In some embodiments, the plurality of silicide blocking structures 128a-d are disposed on the semiconductor substrate 102, the gate 120, and the isolation structure 110. In further embodiments, the silicide blocking structures 128a-d comprise or are a resist protective oxide (RPO). In yet further embodiments, the silicide blocking structures 128a-d may comprise, for example, an oxide (e.g., $SiO_2$), a nitride (e.g., oxygen-doped silicon nitride), an oxy-nitride (e.g., silicon oxy-nitride (Si-$O_XN_Y$)), some other material suitable to prevent silicide formation, or a combination of the foregoing.

In some embodiments, the first silicide blocking structure 128a partially covers the gate 120, partially covers the second source/drain region 114b, and partially covers the isolation structure 110. In further embodiments, the first silicide blocking structure 128a partially covers a first well pickup region of the well pickup regions 106. For example, the first silicide blocking structure 128a may cover a first portion of the gate 120, a first portion of the second source/drain region 114b, a first portion of the isolation structure 110, and a first portion of the first well pickup region.

Thus, the first silicide blocking structure 128a may prevent the silicide process from forming a silicide layer that would short circuit the FET 100. For example, the first silicide blocking structure 128a may prevent a short circuit between the second source/drain region 114b and the first source/drain region 114a, the second source/drain region 114b and the gate electrode 122, the second source/drain region 114b and the first well pickup region, some other short circuiting of the FET 100, or a combination of the foregoing.

In some embodiments, the second silicide blocking structure 128b partially covers the gate 120, partially covers the second source/drain region 114b, and partially covers the isolation structure 110. In further embodiments, the second silicide blocking structure 128b partially covers a second well pickup region of the well pickup regions 106 that is opposite the first well pickup region. For example, the second silicide blocking structure 128b may cover a second portion of the gate 120, a second portion of the second source/drain region 114b, a second portion of the isolation structure 110, and a first portion of the second well pickup region.

Thus, the second silicide blocking structure 128b may prevent the silicide process from forming a silicide layer that would short circuit the FET 100. For example, the second silicide blocking structure 128b may prevent a short circuit between the second source/drain region 114b and the first source/drain region 114a, the second source/drain region 114b and the gate electrode 122, the second source/drain region 114b and the second well pickup region, some other short circuiting of the FET 100, or a combination of the foregoing.

It will be appreciated that, in some embodiments, the third silicide blocking structure 128c and the fourth silicide blocking structure 128d may prevent the silicide process from forming a silicide layer that would short circuit the FET 100 in a substantially similar manner as the first silicide blocking structure 128a and the second silicide blocking structure 128b, respectively, but with regards to the first source/drain region 114a. Thus, the plurality of silicide blocking structures 128a-d may allow the silicide process to be performed on the FET 100 to form a plurality of silicide layers (e.g., first silicide layers 108, second silicide layers 118, third silicide layer 126, etc.), which may improve contact resistance of the FET 100, while also reducing flicker noise and RTN of the FET 100 by having the outer perimeter of the gate 120 disposed within the inner perimeter 110p of the isolation structure 110. It will be appreciated the, in some embodiments, the plurality of silicide blocking structures 128a-d may be shaped substantially similar and/or cover substantially similar portions of the FET 100, while in other embodiments the plurality of silicide blocking structures 128a-d may be shaped differently and/or cover different portion of the FET 100.

Figure 2:
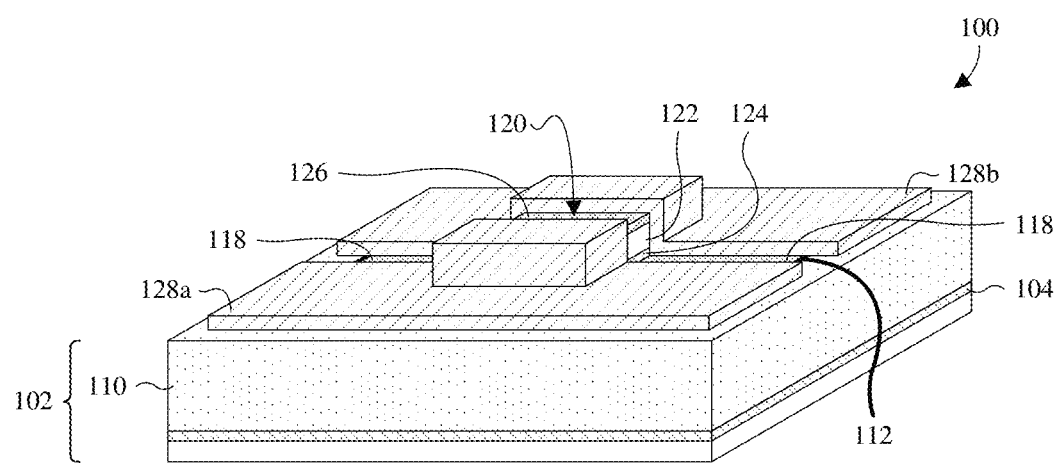
FIG. 2 illustrates a perspective view of some other embodiments of the FET of FIG. 1.

FIG. 2 illustrates a perspective view of some other embodiments of the FET 100 of FIG. 1.

As shown in FIG. 2, the first silicide blocking structure 128a continuously extends from beyond a first side of the device region 112 to beyond a second side of the device region opposite the first side of the device region. In such embodiments, the first silicide blocking structure 128a may cover a third portion of the isolation structure 110, which comprise portions of the isolation structure 110 disposed on opposite sides of the device region 112. In further embodiments, the first silicide blocking structure 128a completely covers the first well pickup region. In such embodiments, one of the first silicide layers 108 may not be disposed on the first well pickup region.

In some embodiments, the second silicide blocking structure 128b is spaced from the first silicide blocking structure 128a and continuously extends from beyond the first side of the device region 112 to beyond the second side of the device region. The second silicide blocking structure 128b may cover a fourth portion of the isolation structure 110, which comprise portions of the isolation structure 110 disposed on the opposite sides of the device region 112, that is spaced from the third portion of the isolation structure 110. In further embodiments, the second silicide blocking structure 128b completely covers the second well pickup region. In such embodiments, one of the first silicide layers 108 may not be disposed on the second well pickup region.

Figure 3A:
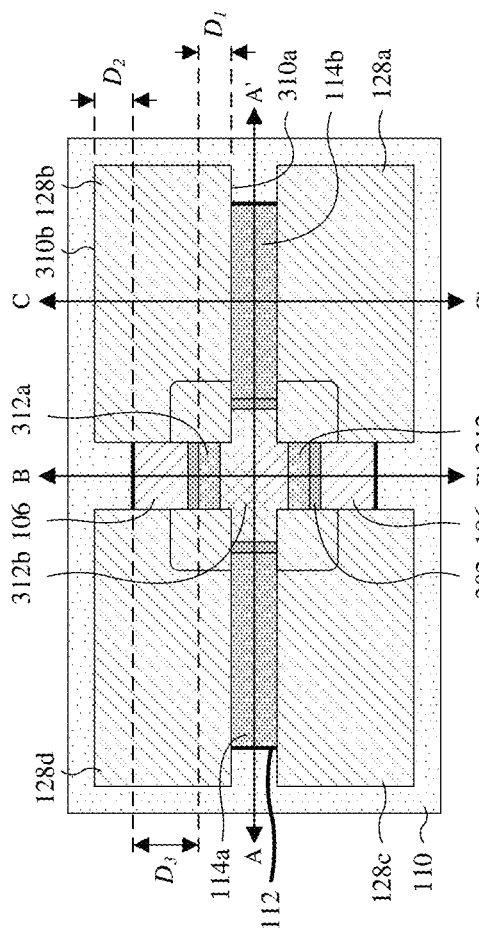
FIGS. 3A-3D illustrate various views of various more detailed embodiments of the FET of FIGS. 1A-1C.
Figure 3B:
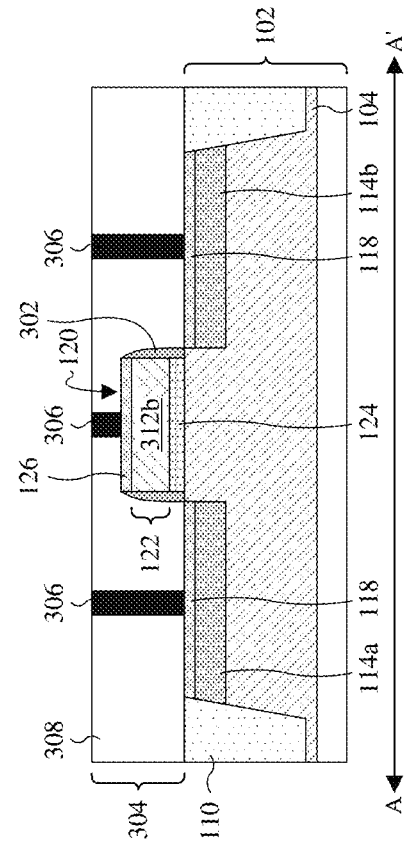
Figure 3C:
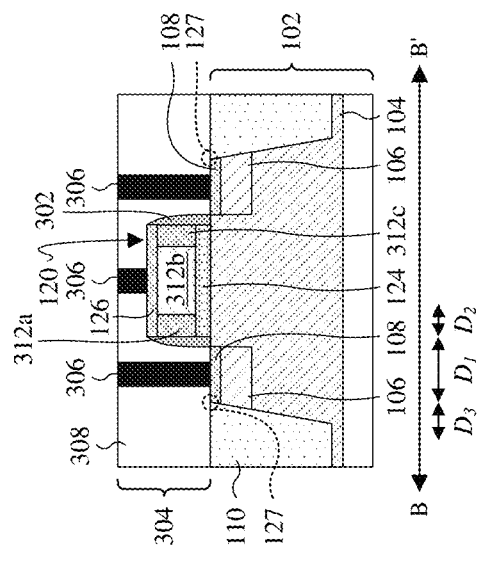
Figure 3D:
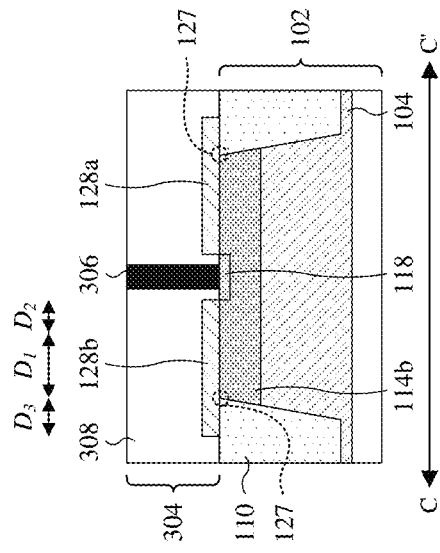

FIGS. 3A-3D illustrate various views of various more detailed embodiments of the FET of FIGS. 1A-1C. FIG. 3A is a top layout view of some embodiments of the FET of FIGS. 3B-3D with an interconnect structure 304, the first silicide layers 108, the second silicide layers 118, and the third silicide layer 126 removed. FIG. 3B is a cross-sectional view of some embodiments of the FET of FIG. 3A taken along line A-A'. FIG. 3C is a cross-sectional view of some embodiments of the FET of FIG. 3A taken along line B-B'. FIG. 3D is a cross-sectional view of some embodiments of the FET of FIG. 3A taken along line C-C'.

As shown in FIGS. 3A-3D, a sidewall spacer 302 is disposed over the device region 112 and is disposed along sides of the gate 120. For example, the sidewall spacer 302 is disposed along sidewalls of the gate electrode 122 and sidewalls of the gate dielectric 124. In some embodiments, the sidewall spacer 302 is disposed along sides of the third silicide layer 126. In further embodiments, the sidewall spacer 302 laterally surrounds the gate 120. In yet further embodiments, the sidewall spacer 302 may comprise, for example, an oxide (e.g., $SiO_2$), a nitride (e.g., silicon nitride (e.g., SiN)), an oxy-nitride (e.g., $SiO_XN_Y$), some other dielectric material, or a combination of the foregoing.

An interconnect structure 304 is disposed over the plurality of silicide blocking structures 128a-d, the gate 120, the sidewall spacer 302, the first silicide layers 108, the second silicide layers 118, and the third silicide layer 126. The interconnect structure 304 comprise a plurality of conductive contacts 306 disposed in an interlayer dielectric (ILD) layer 308. In some embodiments, the conductive contacts 306 may comprise, for example, tungsten, copper, aluminum, some other conductive material, or a combination of the foregoing. In further embodiments, the ILD layer 308 may comprise or be, for example, a low-k dielectric layer (e.g., a dielectric with a dielectric constant less than about 3.9), an ultra-low-k dielectric layer, an oxide layer (e.g., $SiO_2$), some other dielectric layer, or a combination of the foregoing. It will be appreciated that, in some embodiments, the interconnect structure 304 comprises additional dielectric layers and conductive features (e.g., metal lines, metal vias, etc.) disposed over the ILD layer 308 and the conductive contacts 306.

A first sidewall 310a of the second silicide blocking structure 128b is disposed between first opposite sidewalls of the gate 120. One of the first opposite sidewalls of the gate 120 is disposed between the first sidewall 310a and a second sidewall 310b of the second silicide blocking structure 128b that is opposite the first sidewall 310a. In some embodiments, the first sidewall 310a is spaced from the one of the first opposite sidewalls of the gate 120 by a first distance $D_1$. In some embodiments, the first distance $D_1$ is between about 0 micrometers (um) and 1 um. In further embodiments, the first distance $D_1$ is about 0.1 um. In yet further embodiments, a shortest distance between the first sidewall 310a and the one of the first opposite sidewalls of the gate 120 is less than or equal to about 1 um.

The second sidewall 310b may be disposed between the inner perimeter 110p of the isolation structure 110 and an outer perimeter of the isolation structure 110. In further embodiments, the second sidewall 310b is spaced from the inner perimeter 110p of the isolation structure by a second distance $D_2$. In further embodiments, the second distance $D_2$ is between about 0 um and about 1 um. In further embodiments, the second distance $D_2$ is about 0.1 um. In yet further embodiments, a shortest distance between the second sidewall 310b and the inner perimeter 110p of the isolation structure 110 is less than or equal to about 1 um.

In some embodiments, the one of the first opposite sidewalls of the gate 120 is spaced from the inner perimeter 110p of the isolation structure 110 by a third distance $D_3$. In further embodiments, the third distance $D_3$ is between about 0 um and about 1 um. In further embodiments, the third distance $D_3$ is about 0.2 um. In yet further embodiments, a shortest distance between the one of the first opposite sidewalls of the gate 120 and the inner perimeter 110p of the isolation structure 110 is less than or equal to about 1 um. It will be appreciated that, in some embodiments, corresponding sidewalls of the fourth silicide blocking structure 128d are spaced from the one of the first opposite sidewalls of the gate 120 and/or the inner perimeter 110p of the isolation structure 110 by substantially the same distances as the sidewalls of the second silicide blocking structure 128b. It will be appreciated that, in some embodiments, corresponding sidewalls of the first silicide blocking structure 128a and the third silicide blocking structure 128c are spaced from another one of the first opposite sidewalls of the gate 120 and/or the inner perimeter 110p of the isolation structure 110 by substantially the same distances as the sidewalls of the second silicide blocking structure 128b.

The gate electrode 122 may comprise a plurality of doped regions 312a-c. For example, the gate electrode 122 may comprise a first doped region 312a, a second doped region 312b, and a third doped region 312c. The second doped region 312b is disposed in a central region of the gate electrode 122 that is between the first doped region 312a and the third doped region 312c. In some embodiments, the first doped region 312a and the third doped region 312c have the same doping type as the first well 104, while the second doped region 312b has a different doping type than the first well 104. For example, the first doped region 312a and the third doped region 312c may have the first doping type, and the second doped region 312b may have the second doping type. In further embodiments, the first doped region 312a and the third doped region 312c may have greater concentrations of the first dopants (e.g., n-type dopants) than the first well 104.

Because the second doped region 312b is disposed between the first doped region 312a and the third doped region 312c, and because the second doped region 312b has a different doping type than the first doped region 312a and the third doped region 312c, flicker noise and RTN of the FET may be further reduced. For example, during operation of the FET, an inversion region may form that is spaced even further away from the inner perimeter 110p of the isolation structure 110. This, in turn, reduces charge carriers from being trapped and de-trapped at the isolation corners 127, thereby resulting in the FET having low flicker noise and low RTN.

Figure 4C:
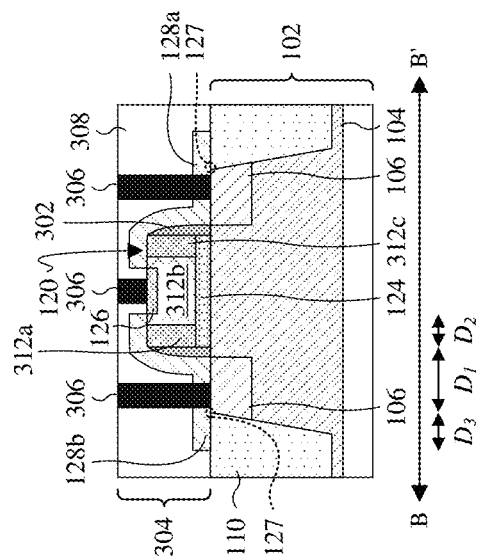
FIGS. 4A-4D illustrate various views of various more detailed embodiments of the FET of FIG. 2.
Figure 4D:
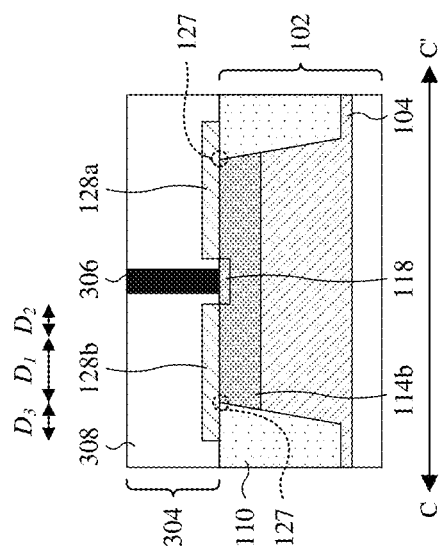
Figure 4A:
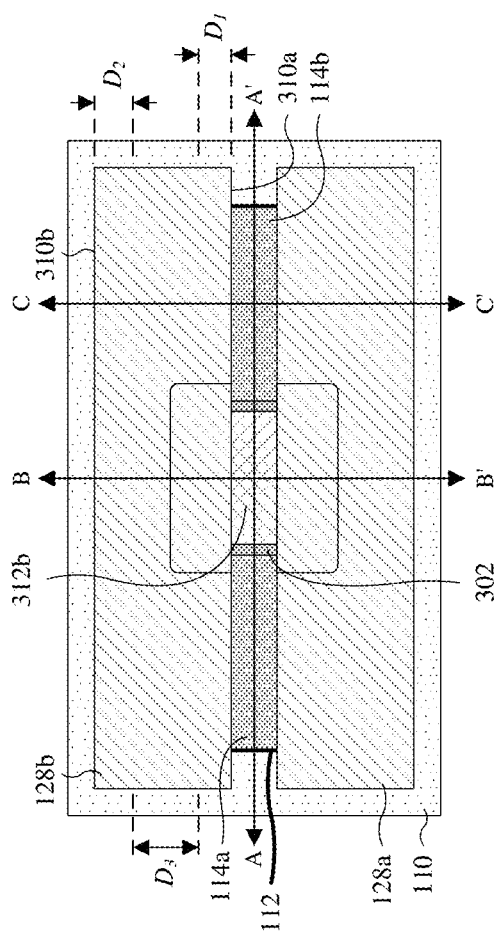
Figure 4B:
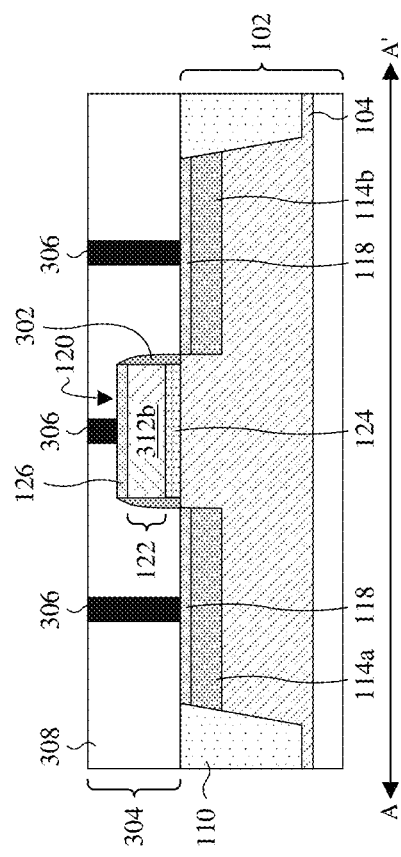

FIGS. 4A-4D illustrate various views of various more detailed embodiments of the FET of FIG. 2. FIG. 4A is a top layout view of some embodiments of the FET of FIGS. 4B-4D with the interconnect structure 304, the first silicide layers 108, the second silicide layers 118, and the third silicide layer 126 removed. FIG. 4B is a cross-sectional view of some embodiments of the FET of FIG. 4A taken along line A-A'. FIG. 4C is a cross-sectional view of some embodiments of the FET of FIG. 4A taken along line B-B'. FIG. 4D is a cross-sectional view of some embodiments of the FET of FIG. 4A taken along line C-C'.

As shown in FIGS. 4A-4D, in some embodiments, the third silicide layer 126 is disposed on the second doped region 312b and spaced from the first doped region 312a and the third doped region 312c. In further embodiments, the second silicide blocking structure 128b may continuously extend from one side of the gate 120 to an opposite side of the gate 120. In yet further embodiments, the first silicide blocking structure 128a is spaced from the second silicide blocking structure 128b and may also continuously extend from the one side of the gate 120 to the opposite side of the gate 120.

Because the third silicide layer 126 is disposed on the second doped region 312b and spaced from the first doped region 312a and/or the third doped region 312c, flicker noise and RTN of the FET may be further reduced. For example, during operation of the FET, depletion regions between the second doped region 312b and the first doped region 312a and/or the second doped region 312b may become larger, thereby causing an inversion region may to form spaced even further away from the inner perimeter 110p of the isolation structure 110. This, in turn, reduces charge carriers from being trapped and de-trapped at the isolation corners 127, thereby resulting in the FET having low flicker noise and low RTN.

FIGS. 5A-5D illustrate various views of other embodiments of the FET of FIGS. 3A-3D. FIG. 5A is a top layout view of some embodiments of the FET of FIGS. 5B-5D with the interconnect structure 304, the first silicide layers 108, the second silicide layers 118, and the third silicide layer 126 removed. FIG. 5B is a cross-sectional view of some embodiments of the FET of FIG. 5A taken along line A-A'. FIG. 5C is a cross-sectional view of some embodiments of the FET of FIG. 5A taken along line B-B'. FIG. 5D is a cross-sectional view of some embodiments of the FET of FIG. 5A taken along line C-C'.

As shown in FIGS. 5A-5D, in some embodiments, a second well 502 is disposed in the semiconductor substrate 102. The second well 502 is a region of the semiconductor substrate 102 having a same doping type as the first source/drain region 114a and the second source/drain region 114b. In further embodiments, the second well 502 is disposed directly beneath the gate 120 and continuously extends from the first source/drain region 114a to the second source/drain region 114b.

In some embodiments, a third well 504 is disposed in the semiconductor substrate 102. The third well 504 is a region of the semiconductor substrate 102 having a same doping type as the first well 104. In further embodiments, the third well 504 is disposed beneath the gate 120 and continuously extends from the first source/drain region 114a to the second source/drain region 114b. In yet further embodiments, the third well 504 is disposed between the gate 120 and the second well 502. Because the second well 502 has the same doping type as the first source/drain region 114a and the second source/drain region 114b, the second well 502 provides a conductive channel between the first source/drain region 114a and the second source/drain region 114b. In such embodiments, the FET may be referred to as a JFET.

Figure 6A:
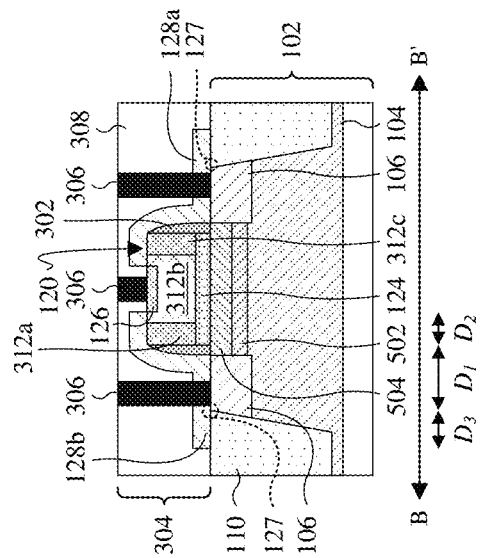
FIGS. 6A-6D illustrate various views of other embodiments of the FET of FIGS. 4A-4D.
Figure 6C:
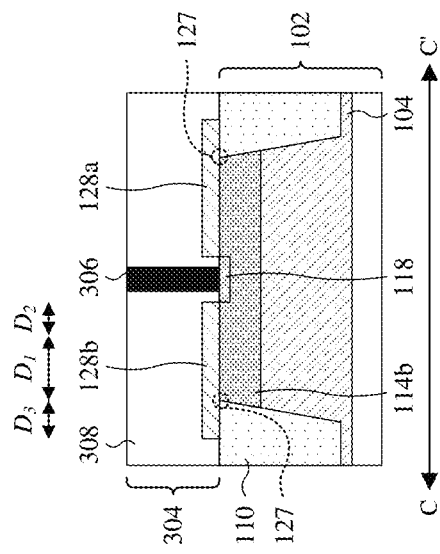
Figure 6B:
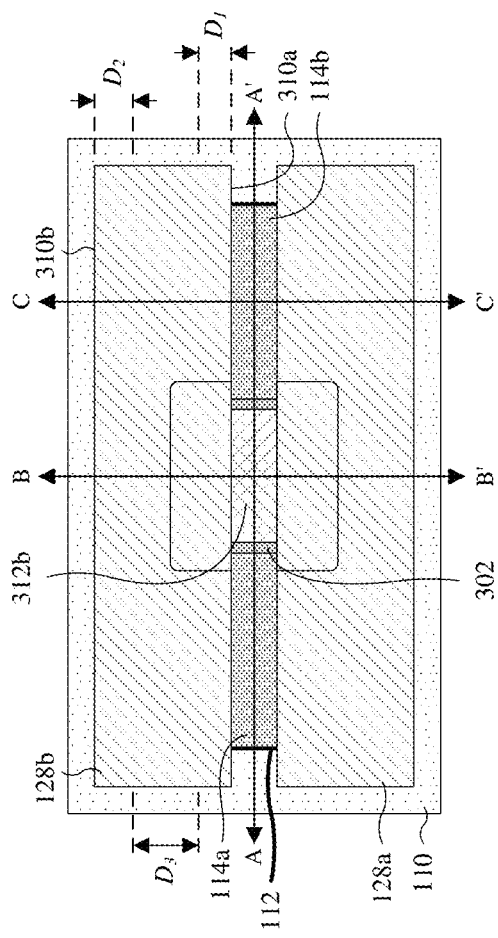
Figure 6D:
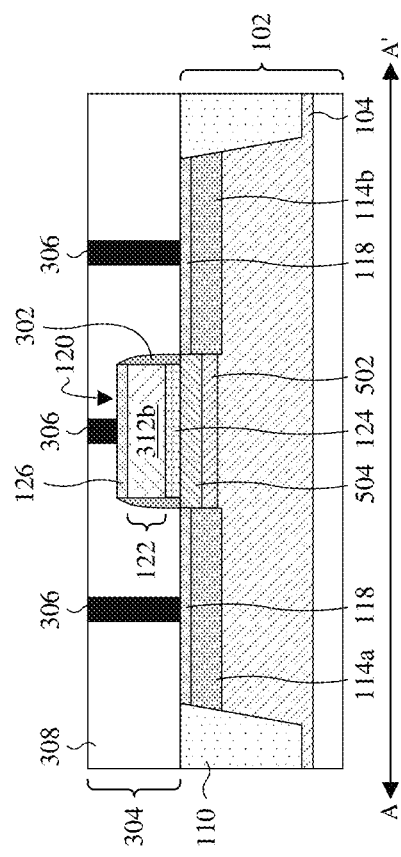
Figure 7C:
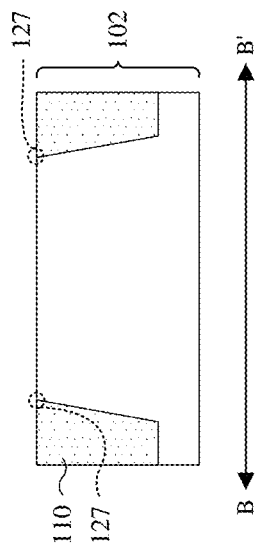
FIGS. 7A-7D through 16A-16D illustrate a series of views of some embodiments of a method for forming a FET with low flicker noise and low RTN.
Figure 7D:
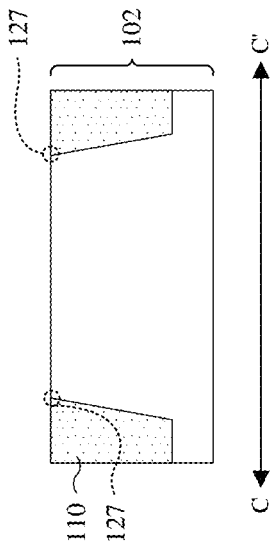
Figure 7A:
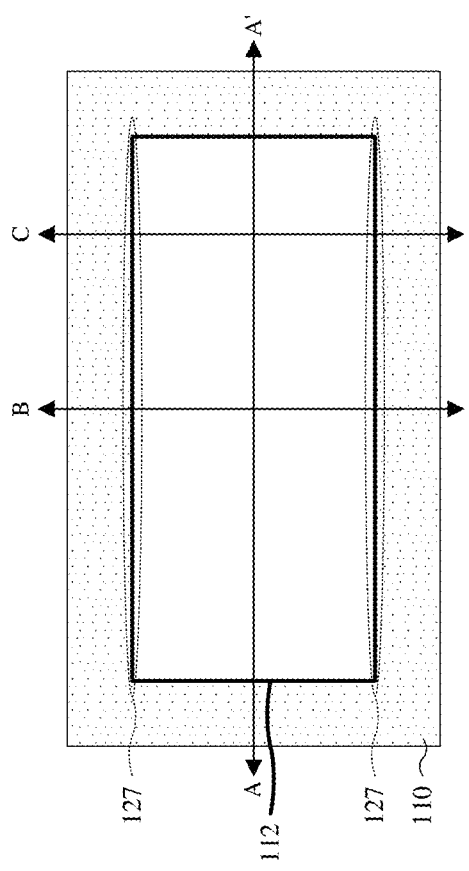
Figure 7B:
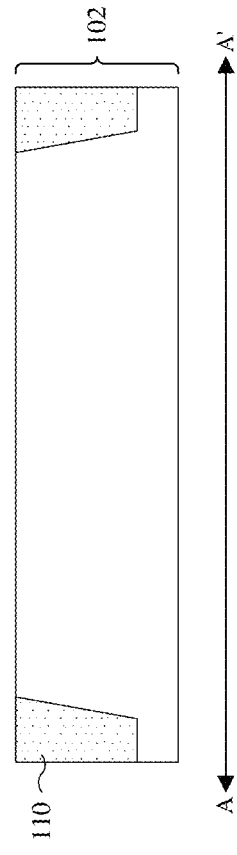
Figure 8C:
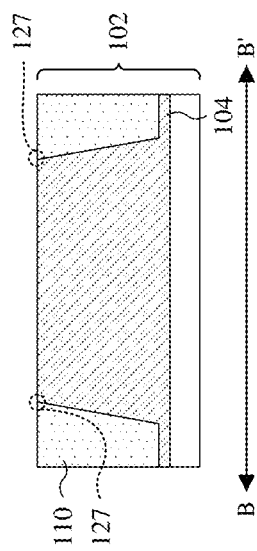
Figure 8D:
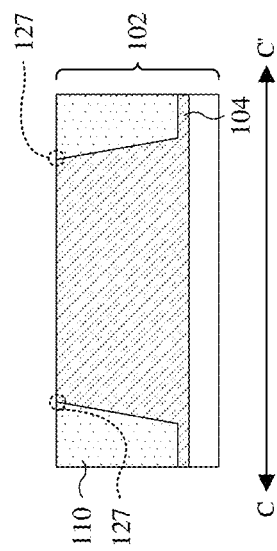
Figure 8A:
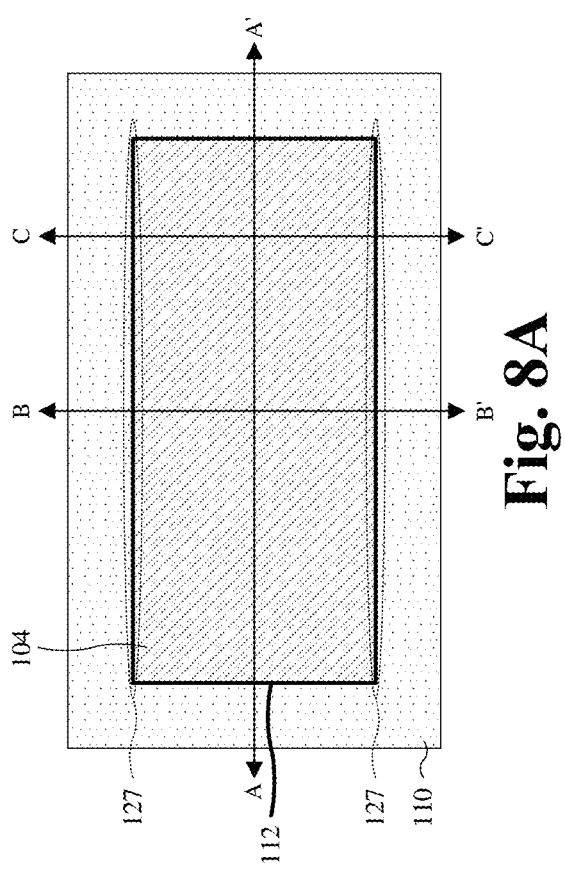
Figure 8B:
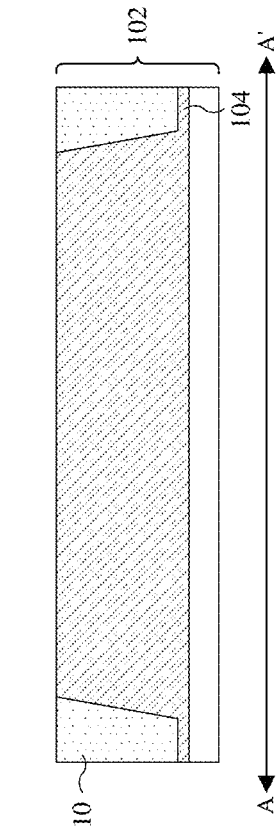
Figure 9C:
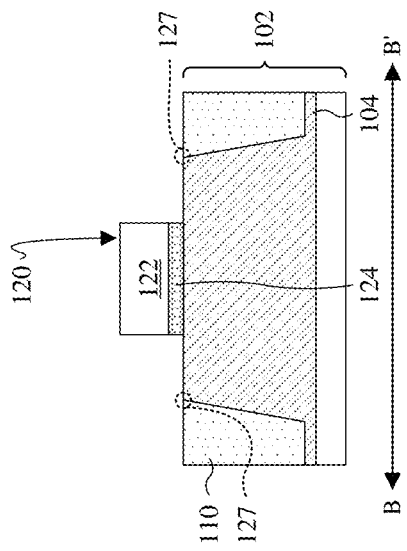
Figure 9D:
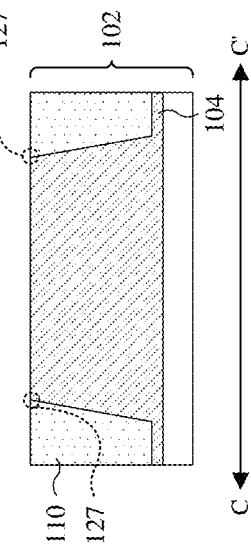
Figure 9A:
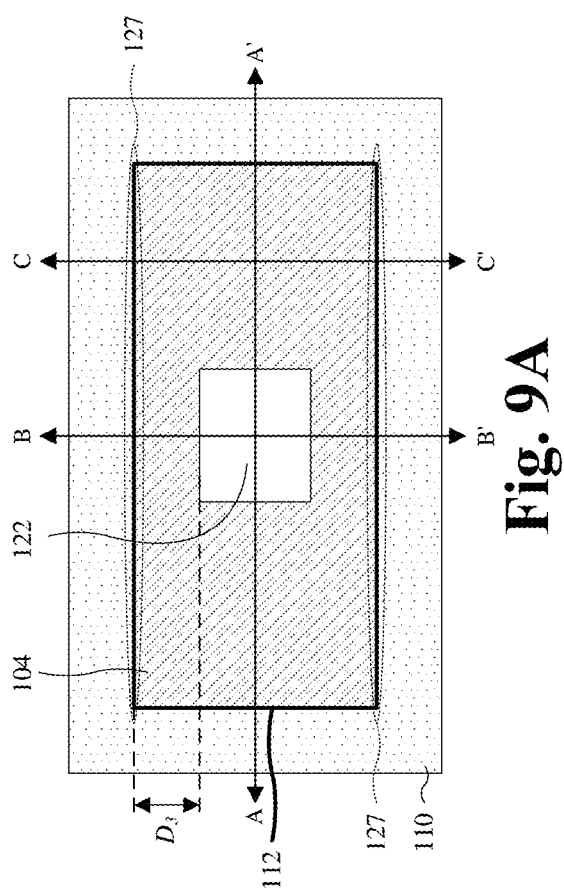
Figure 9B:
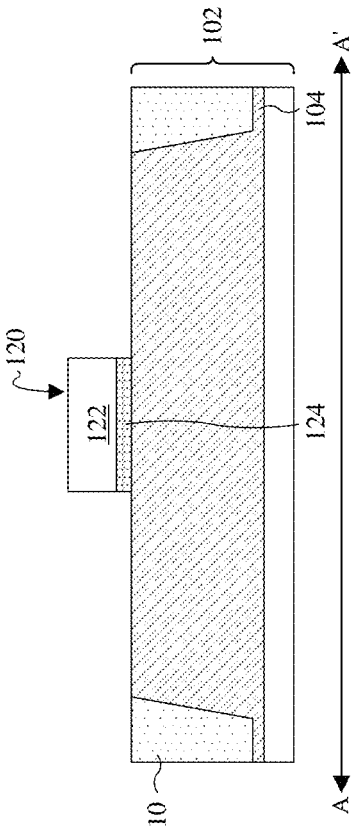
Figure 10C:
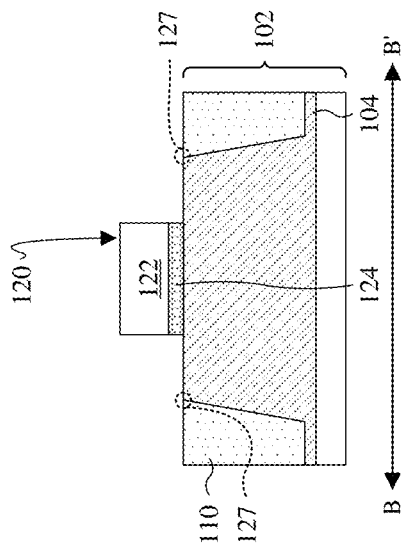
Figure 10D:
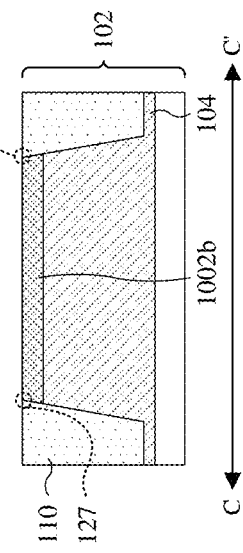
Figure 10A:
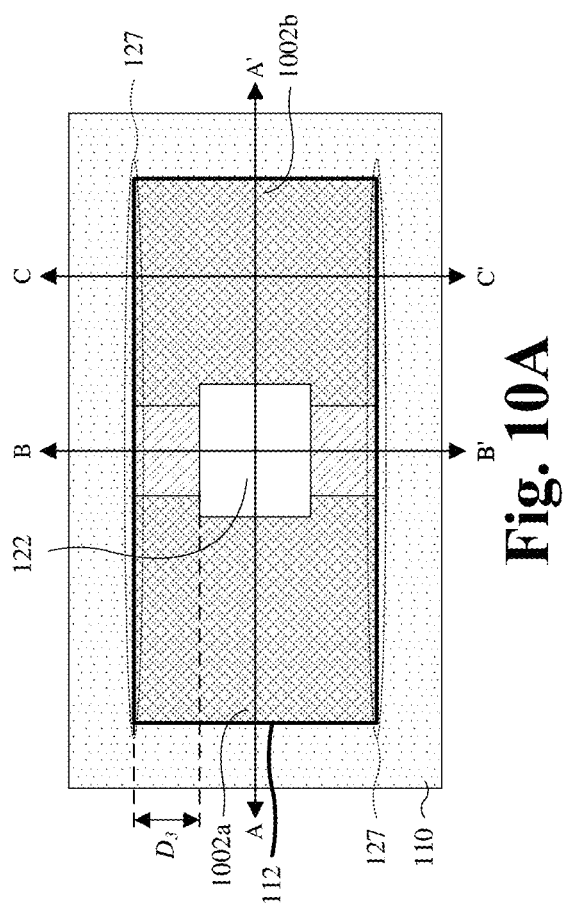
Figure 10B:
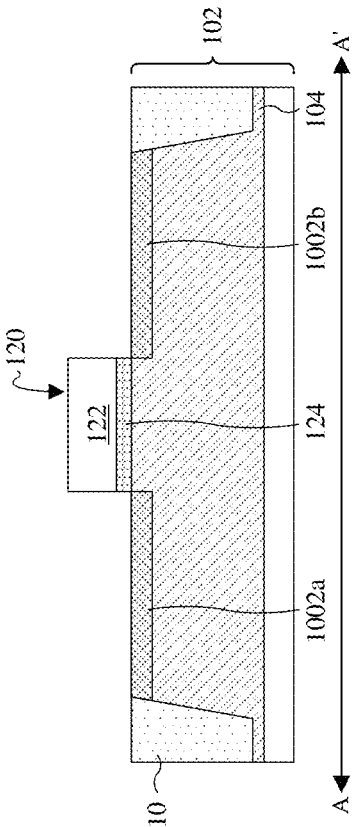
Figure 11C:
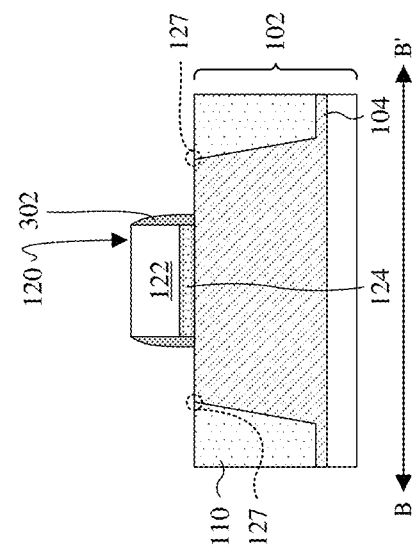
Figure 11D:
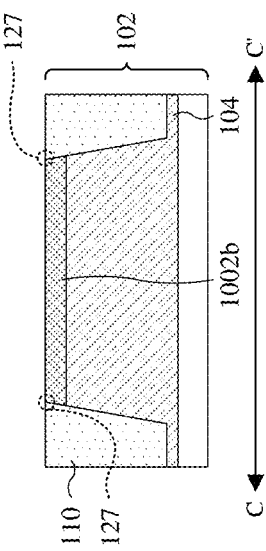
Figure 11A:
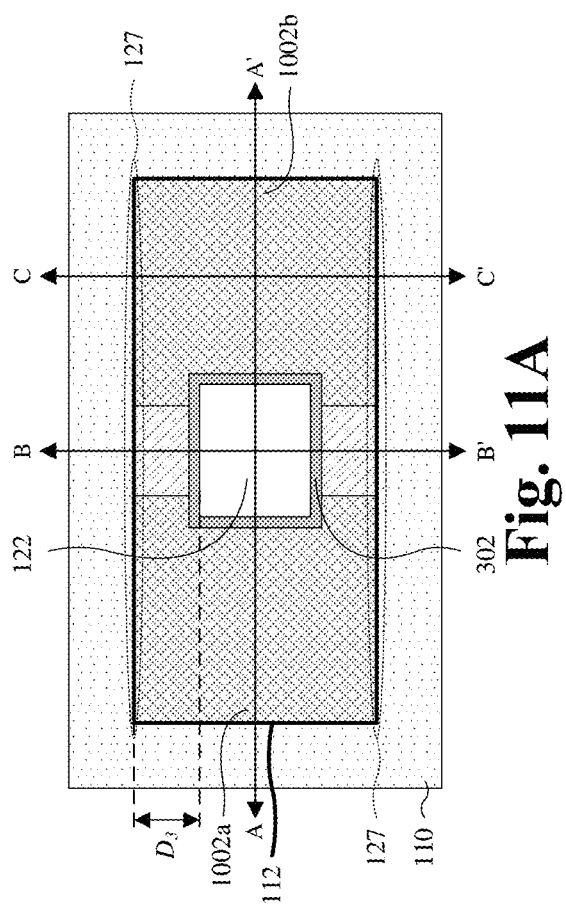
Figure 11B:
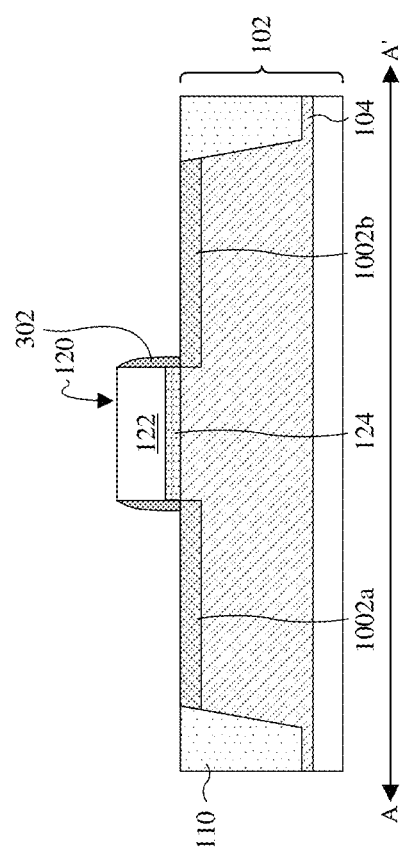
Figure 12A:
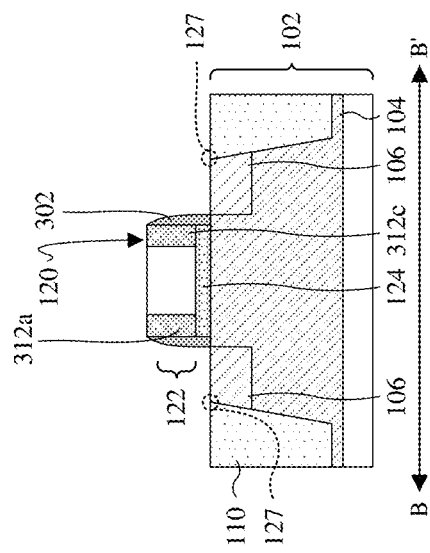
Figure 12C:
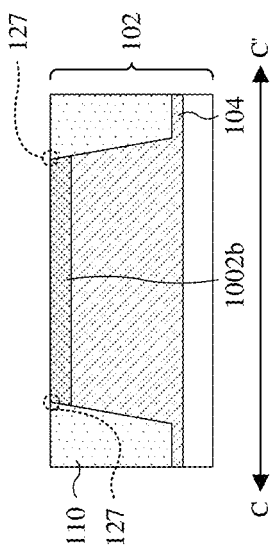
Figure 12B:
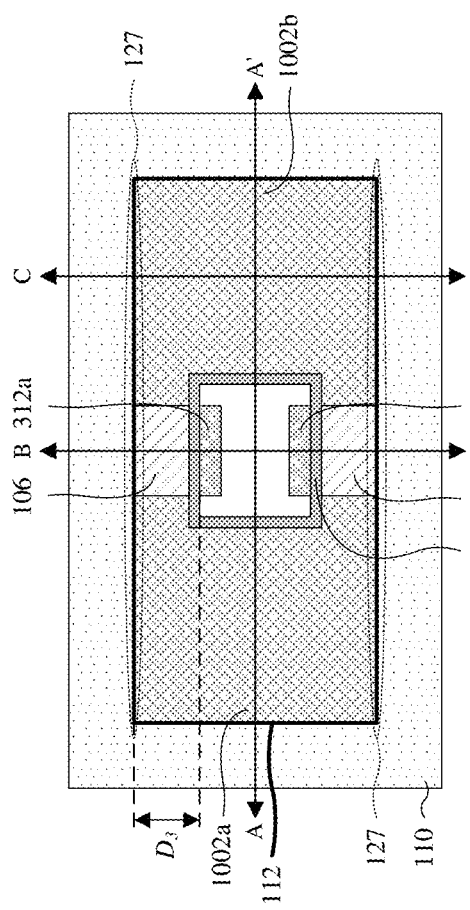
Figure 12D:
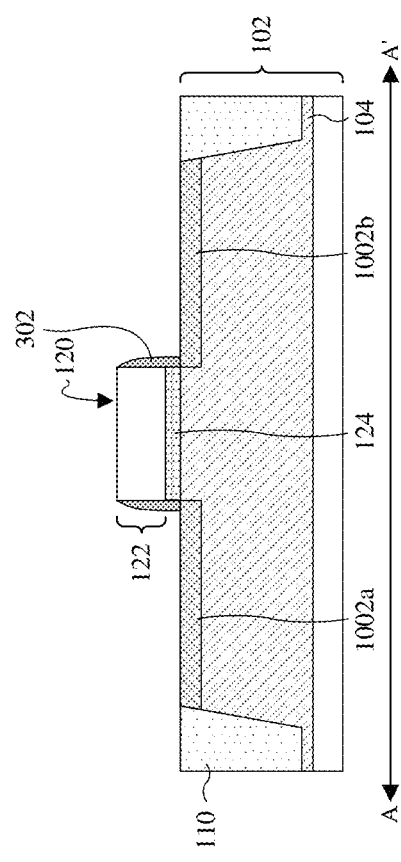
Figure 13C:
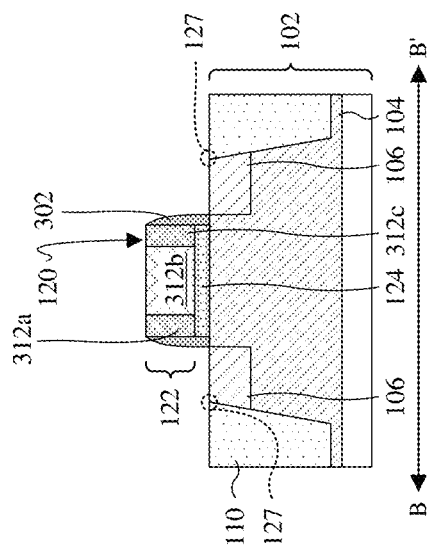
Figure 13D:
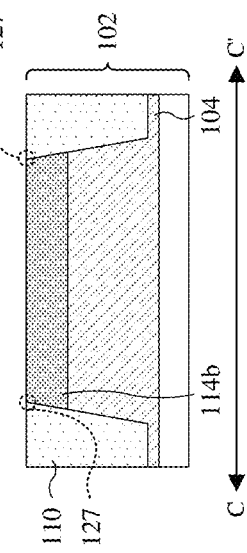
Figure 13A:
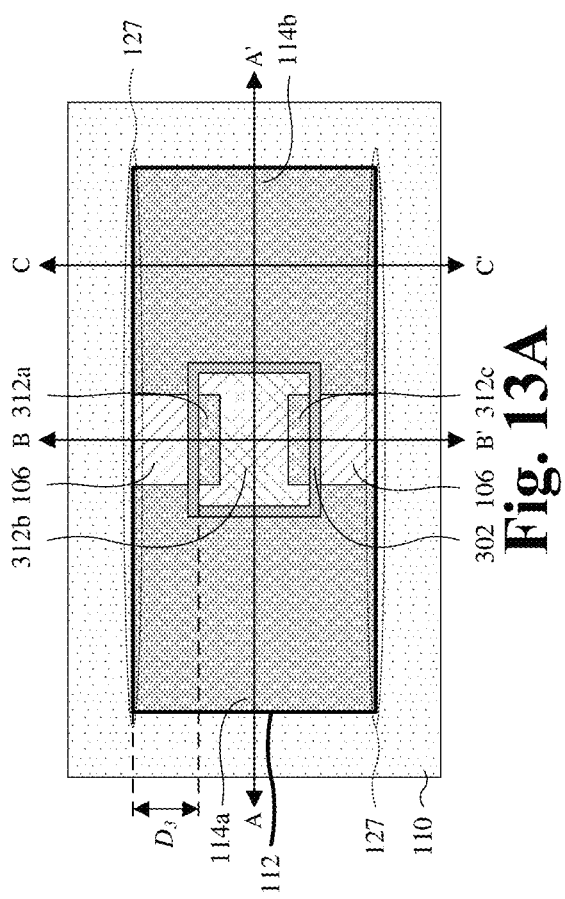
Figure 13B:
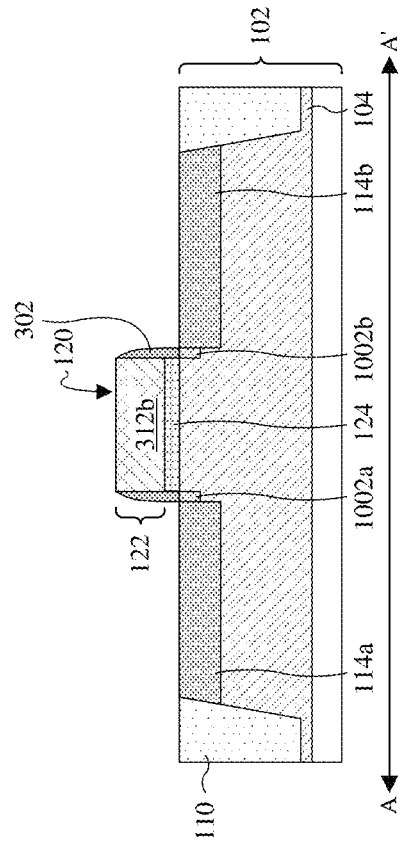
Figure 16A:
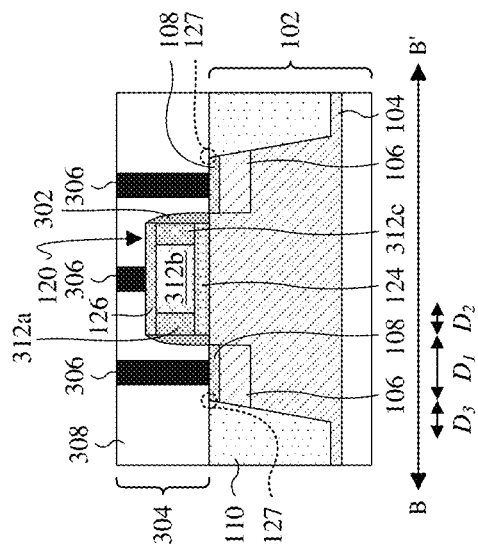
Figure 16D:
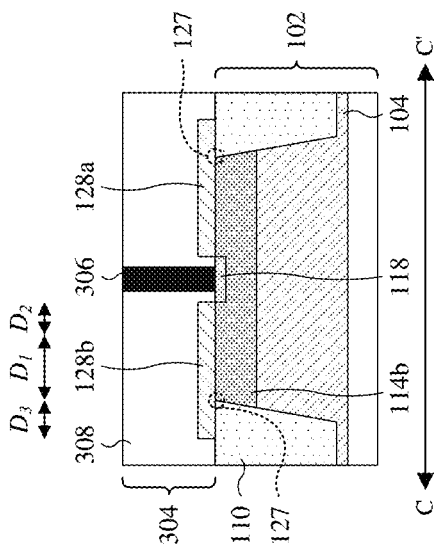
Figure 16B:
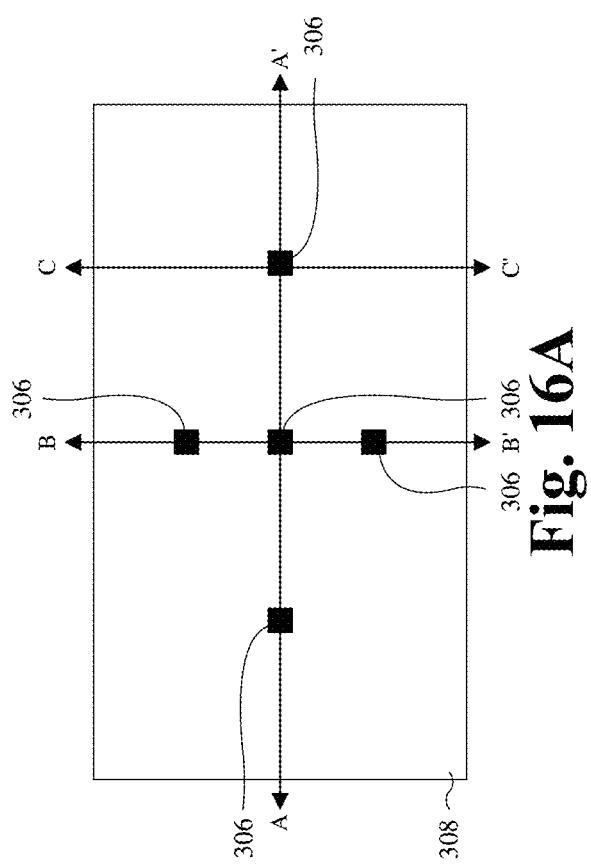
Figure 16C:
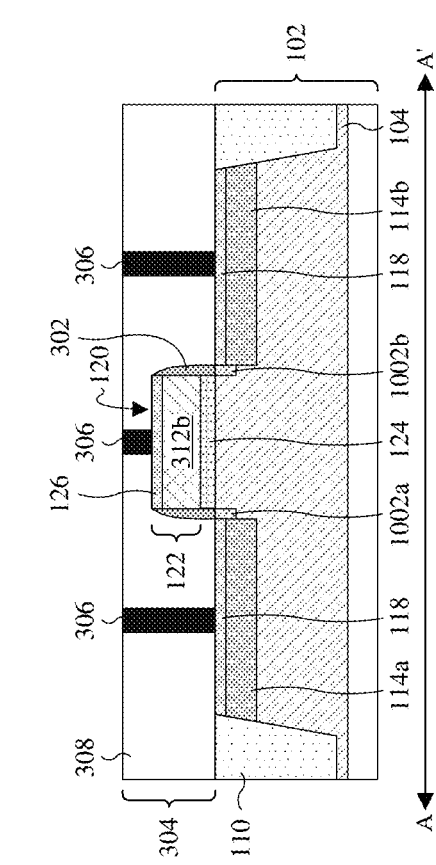

FIGS. 6A-6D illustrate various views of other embodiments of the FET of FIGS. 4A-4D. FIG. 6A is a top layout view of some embodiments of the FET of FIGS. 6B-6D with the interconnect structure 304, the first silicide layers 108, the second silicide layers 118, and the third silicide layer 126 removed. FIG. 6B is a cross-sectional view of some embodiments of the FET of FIG. 6A taken along line A-A'. FIG. 6C is a cross-sectional view of some embodiments of the FET of FIG. 6A taken along line B-B'. FIG. 6D is a cross-sectional view of some embodiments of the FET of FIG. 6A taken along line C-C'.

As shown in FIGS. 6A-6D, the third well 504 is disposed between the gate 120 and the second well 502. Because the second well 502 has the same doping type as the first source/drain region 114a and the second source/drain region 114b, the second well 502 provides a conductive channel between the first source/drain region 114a and the second source/drain region 114b. In such embodiments, the FET may be referred to as a JFET.

FIGS. 7A-7D through 16A-16D illustrate a series of views of some embodiments of a method for forming a FET with low flicker noise and low RTN. Figures having a suffix of "A" (e.g., FIG. 7A) are top views of the FET during various steps of the method of formation. Figures having a suffix of "B" (e.g., FIG. 7B) are cross-sectional views of the FET taken along line A-A' in the figures having a suffix of "A," respectively. Figures having a suffix of "C" (e.g., FIG. 7C) are cross-sectional views of the FET taken along line B-B' in the figures having a suffix of "A," respectively. Figures having a suffix of "D" (e.g., FIG. 7D) are cross-sectional views of the FET taken along line C-C' in the figures having a suffix of "A," respectively. The FET may, for example, be substantially similar to the FET of FIGS. 3A-3D.

As shown in FIGS. 7A-7D, an isolation structure 110 is formed in a semiconductor substrate 102. The isolation structure 110 is formed demarcating a device region 112 of the semiconductor substrate 102. In some embodiments, the isolation structure 110 may be formed by selectively etching the semiconductor substrate 102 to form a trench in the semiconductor substrate 102, and subsequently filling the trench with a dielectric material. The semiconductor substrate 102 may be selectively etched by forming a masking layer (not shown) over the semiconductor substrate 102, and subsequently exposing the semiconductor substrate 102 to an etchant configured to selectively remove unmasked portions of the semiconductor substrate 102. In further embodiments, a pair of isolation corners 127 are formed due to the formation of the isolation structure 110. In yet further embodiments, the dielectric material may comprise an oxide (e.g., $SiO_2$), a nitride, a carbide, or the like.

As shown in FIGS. 8A-8D, a first well 104 is formed in the device region 112 of the semiconductor substrate 102.

The first well 104 is a region of the semiconductor substrate 102 having a first doping type (e.g., n-type doping). In some embodiments, the first well 104 has a doping type opposite that of adjoining regions of the semiconductor substrate 102, or the adjoining regions of the semiconductor substrate may be intrinsic. In some embodiments, the first well 104 is formed with a first concentration of first dopants (e.g., n-type dopants). In further embodiments, the first well 104 may be formed by an ion implantation process and may utilize a masking layer (not shown) to selectively implant ions into the semiconductor substrate 102.

As shown in FIGS. 9A-9D, a gate 120 is formed over the semiconductor substrate 102 and over the device region 112. The gate 120 is formed having an outer perimeter that is within an inner perimeter of the isolation structure 110. The gate comprises a gate electrode 122 disposed on a gate dielectric 124. In some embodiments, the gate 120 is formed with a sidewall that is spaced from the inner perimeter of the isolation structure 110 by a third distance $D_3$. In further embodiments, the third distance $D_3$ is between about 0 um and about 1 um.

In some embodiments, a process for forming the gate 120 comprises depositing or growing a dielectric layer (not shown) on the semiconductor substrate 102. The dielectric layer may be, for example, silicon dioxide, a high-k dielectric, or some other dielectric. In further embodiments, the dielectric layer may be deposited or grown by thermal oxidation, chemical vapor deposition (CVD), physical vapor deposition (PVD), atomic layer deposition (ALD), sputtering, or some other deposition or growth process.

Thereafter, a processing layer (not shown) is formed on the dielectric layer. In some embodiments, the processing layer may be, for example, polysilicon. In other embodiments, the processing layer may be doped polysilicon, metal, or some other conductor. In further embodiments, the processing layer may be formed by, for example, CVD, PVD, ALD, sputtering, electrochemical plating, electroless plating, or some other deposition or growth process.

After the processing layer is formed on the dielectric layer, the processing layer and the dielectric layer are patterned into the gate 120. In some embodiments, a process for pattering the processing layer and the dielectric layer comprises forming a patterned masking layer (not shown) on the processing layer. In further embodiments, the patterned masking layer may be formed by a spin on process and patterned using photolithography. In yet further embodiments, the process comprises performing an etch into the processing layer and the dielectric layer with the patterned masking layer in place, thereby forming the gate electrode 122 and the gate dielectric 124, respectively. Subsequently, the patterned making layer may be stripped away.

As illustrated by FIGS. 10A-10D, a pair of lightly-doped source/drain extensions 1002a-b are formed in the first well 104. For example, a first lightly-doped source/drain extension 1002a is formed on a first side of the gate 120, and a second lightly lightly-doped source/drain extension 1002b is formed on a second side of the gate 120 opposite the first side. In some embodiments, the lightly-doped source/drain extensions 1002a-b comprise a second doping type (e.g., p-type doping) that is different than the first doping type. In further embodiments, the lightly-doped source/drain extensions 1002a-b are formed with a second concentration of second dopants (e.g., p-type dopants). In yet further embodiments, the pair of lightly-doped source/drain extensions 1002a-b may be formed by an ion implantation process and may utilize a masking layer (not shown) to selectively implant ions into the semiconductor substrate 102.

As shown in FIGS. 11A-11D, a sidewall spacer 302 is formed over the semiconductor substrate 102 and along sides of the gate 120. In some embodiments, the sidewall spacer 302 may be formed by depositing a spacer layer over the semiconductor substrate 102, the gate 120, and the isolation structure 110. In further embodiments, the spacer layer may be deposited by PVD, CVD, ALD, sputtering, or some other deposition process. In yet further embodiments, the spacer layer is subsequently etched to remove the spacer layer from horizontal surfaces, thereby forming the sidewall spacer 302 along sides of gate 120. The spacer layer may comprise, for example, an oxide (e.g., $SiO_2$), a nitride (e.g., SiN), an oxy-nitride (e.g., $SiO_XN_Y$), some other dielectric material, or a combination of the foregoing. In some embodiments, the sidewall spacer 302 may be formed prior to forming the lightly-doped source/drain extensions 1002a-b. In such embodiments, the lightly-doped source/drain extensions 1002a-b may be formed using an angled ion implantation process.

As shown in FIGS. 12A-12D, a pair of well pickup regions 106 are formed in the device region 112 on first opposite sides of the gate 120. The well pickup regions 106 are regions of the semiconductor substrate 102 having a same doping type as the first well 104. The well pickup regions 106 are formed with a third concentration of the first dopants that is greater than the first concentration of first dopants.

Further, a first doped region 312a and a third doped region 312c are formed in the gate electrode 122. The first doped region 312a and the third doped region 312c are regions of the gate electrode 122 comprising the same doping type as the first well 104. In some embodiments, the first doped region 312a and the third doped region 312c may have greater concentrations of the first dopants (e.g., n-type dopants) than the first well 104. In further embodiments, the first doped region 312a and the third doped region 312c may have a same doping concentration as the well pickup regions 106.

In some embodiments, the well pickup regions 106, the first doped region 312a, and the third doped region 312c may be formed by an ion implantation process that utilizes a masking layer (not shown) to selectively implant ions into the semiconductor substrate 102 and the gate electrode 122. In further embodiments, the well pickup regions 106, the first doped region 312a, and the third doped region 312c may be formed by a single ion implantation process that utilizes a single masking layer. In other embodiments, the well pickup regions 106, the first doped region 312a, and/or the third doped region 312c may be formed by multiple ion implantation process that utilizes multiple masking layers.

As shown in FIGS. 13A-13D, a first source/drain region 114a and a second source/drain region 114b are formed in the device region 112 on second opposite sides of the gate 120. The second opposite sides of the gate 120 are spaced in a first lateral direction, and the first opposite sides of the gate 120 are spaced in a second lateral direction that is perpendicular to the first lateral direction. The first source/drain region 114a and the second source/drain region 114b are regions of the semiconductor substrate 102 having a same doping type as the pair of lightly-doped source/drain extensions 1002a-b. In further embodiments, the first source/drain region 114a and the second source/drain region 114b are formed with a fourth concentration of the second dopants that is greater than the second concentration of the second dopants.

Further, a second doped region 312b is formed in the gate electrode 122. The second doped region 312b is a region of the gate electrode 122 comprising a same doping type as the first source/drain region 114a and the second source/drain region 114b. In some embodiments, the second doped region 312b may have a greater concentration of the second dopants than the lightly-doped source/drain extensions 1002a-b. In further embodiments, the second doped region 312b may have a same doping concentration as the first source/drain region 114a and/or the second source/drain region 114b.

In some embodiments, the first source/drain region 114a, the second source/drain region 114b, and the second doped region 312b may be formed by an ion implantation process that utilizes a masking layer (not shown) to selectively implant ions into the semiconductor substrate 102 and the gate electrode 122. In further embodiments, the first source/drain region 114a, the second source/drain region 114b, and the second doped region 312b may be formed by a single ion implantation process that utilizes a single masking layer. In other embodiments, the first source/drain region 114a, the second source/drain region 114b, and/or the second doped region 312b may be formed by multiple ion implantation process that utilizes multiple masking layers.

As shown in FIGS. 14A-14D, a plurality of silicide blocking structures 128a-d are formed on the semiconductor substrate 102, the isolation structure 110, the gate 120, and the sidewall spacer 302. In some embodiments, the plurality of silicide blocking structures 128a-d are formed partially covering the device region 112, partially covering the isolation structure 110, partially covering the gate 120, and partially covering the sidewall spacer 302. For example, a second silicide blocking structure 128b is formed partially covering the gate 120, partially covering the second source/drain region 114b, partially covering the isolation structure 110, partially covering the sidewall spacer 302, and partially covering one of the well pickup regions 106.

In some embodiments, the second silicide blocking structure 128b is formed with a first sidewall 310a that is spaced, in the second lateral direction, from a sidewall of the gate 120 by a first distance $D_1$. The first distance $D_1$ may be between about 0 um and about 1 um. In further embodiments, the second silicide blocking structure 128b is formed with a second sidewall 310b that is spaced, in the second lateral direction, from a side of the inner perimeter of the isolation structure 110 by a first distance $D_2$. The second distance $D_2$ may be between about 0 um and about 1 um.

In some embodiments, a process for forming the plurality of silicide blocking structures 128a-d comprises depositing or growing a silicide blocking layer (e.g., a resist protective oxide (RPO) layer) on the semiconductor substrate 102, the isolation structure 110, the gate 120, and the sidewall spacer 302. The silicide blocking layer may be deposited or grown by thermal oxidation, CVD, PVD, ALD, sputtering, or some other deposition or growth process. In further embodiments, the silicide blocking layer may be formed as a conformal layer. Thereafter, a patterned masking layer (not shown) is formed over the silicide blocking layer (e.g., via a spin-on process) and patterned using photolithography. An etch is then performed into the silicide blocking layer with the patterned masking layer in place to remove unmasked portions of the silicide blocking layer, thereby forming the plurality of silicide blocking structures 128a-d. In some embodiments, the patterned masking layer is subsequently stripped away. In yet further embodiments, the silicide blocking layer may comprise, for example, an oxide (e.g., $SiO_2$), a nitride (e.g., oxygen-doped silicon nitride), an oxy-nitride (e.g., $SiO_xN_y$), some other material suitable to prevent silicide formation, or a combination of the foregoing.

As shown in FIGS. 15A-15D, a pair of first silicide layers 108 are formed on/in the well pickup regions 106, a pair of second silicide layers 118 are formed on/in the first source/drain region 114a and the second source/drain region 114b, and a third silicide layer 126 is formed on/in the gate electrode 122. In some embodiments, the first silicide layers 108, the second silicide layers 118, and the third silicide layer 126 are formed with sides that are substantially aligned with sidewalls of the plurality of silicide blocking structures 128a-d.

In some embodiments, a process for forming the first silicide layers 108, the second silicide layers 118, and the third silicide layer 126 comprises depositing a transition metal layer covering the plurality of silicide blocking structures 128a-d, the semiconductor substrate 102, and the isolation structure 110. Subsequently, the transition metal layer is heated so that it reacts with exposed portions of the semiconductor substrate 102 to form the first silicide layers 108, the second silicide layers 118, and the third silicide layer 126. The plurality of silicide blocking structures 128a-d prevent the transition metal from reacting with portions of the semiconductor substrate 102 and the gate 120 in which they cover. Accordingly, the plurality of silicide blocking structures 128a-d may prevent a silicide layer from forming that would short circuit the FET 100. In further embodiments, the process comprises removing unreacted material of the transition metal layer by an etch. In yet further embodiments, the process may be a self-aligned process (e.g., a salicide process).

As shown in FIGS. 16A-16D, an interconnect structure 304 is formed over the semiconductor substrate 102, the gate 120, and the isolation structure 110. In some embodiments, a process for forming the interconnect structure 304 comprises forming an interlayer dielectric (ILD) layer 308, and then forming conductive contacts 306 that extend through the ILD layer 308 to the semiconductor substrate 102 and/or the gate electrode 122. For example, the conductive contacts 306 may extend through the ILD layer 308 to the first silicide layers 108, the second silicide layers 118, and the third silicide layer 126. In further embodiments, the ILD layer 308 may be formed by CVD, PVD, ALD, sputtering, or some other deposition or growth process. In yet further embodiments, a planarization process (e.g., CMP) may be performed on the ILD layer 308 to form a substantially planar upper surface.

In some embodiments, a process for forming the conductive contacts 306 comprises performing an etch into the ILD layer 308 to form contact openings that correspond to the conductive contacts 306. The etch may be performed with a patterned masking layer formed over the ILD layer 308. In further embodiments, the process comprises filling the contact openings with a conductive material (e.g., tungsten). In further embodiments, the contact openings may be filled by depositing a conductive layer covering the ILD layer 308 that fills the contact openings, and subsequently performing a planarization process (e.g., CMP) on the conductive layer. In yet further embodiments, the conductive layer may be deposited by, for example, CVD, PVD, ALD, sputtering, electrochemical plating, electroless plating, or some other deposition or growth process.

Figure 17:
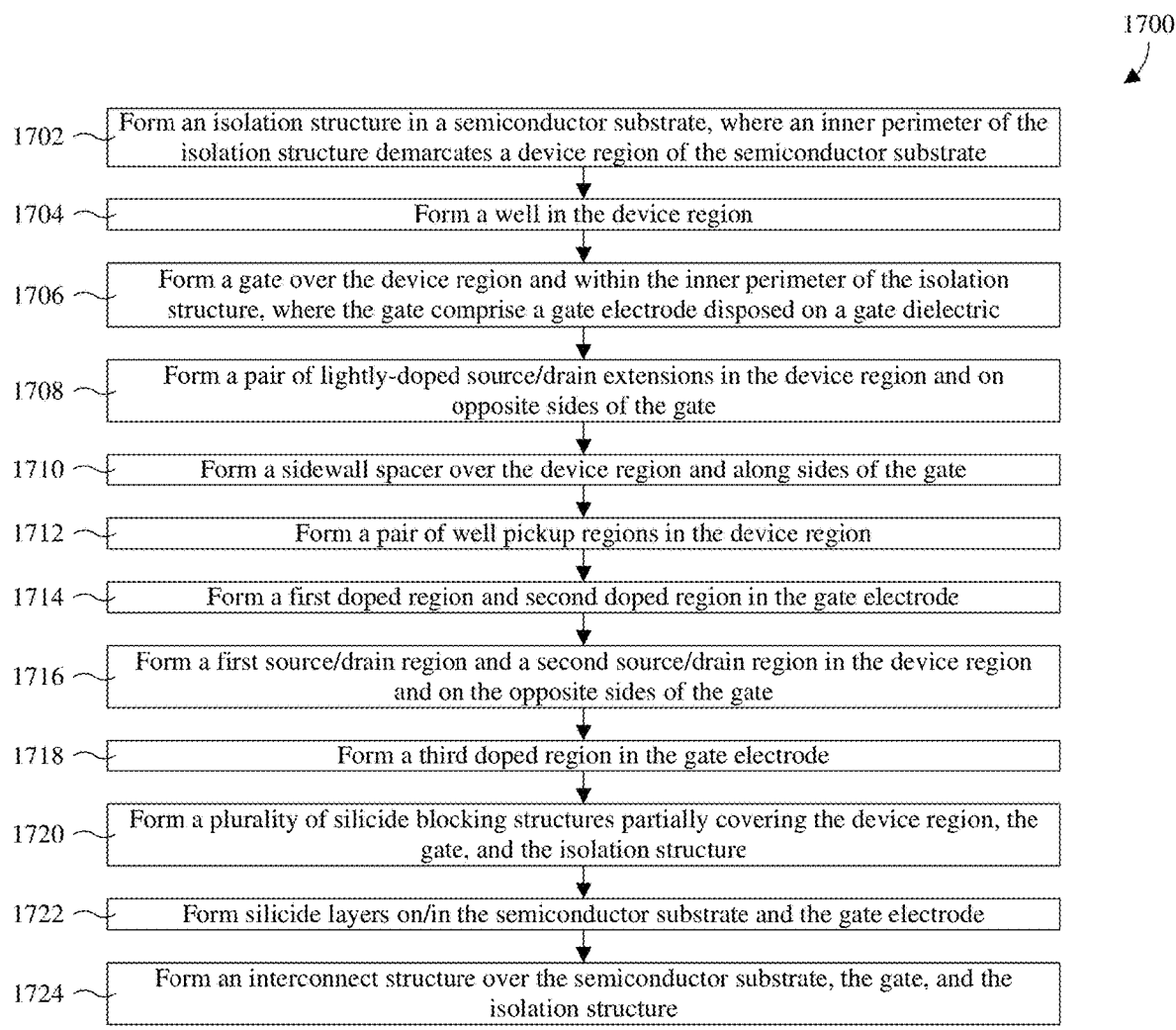
FIG. 17 illustrates a flowchart of some embodiments of a method for forming a FET with low flicker noise and low RTN.

As illustrated in FIG. 17, a flowchart 1700 of some embodiments of a method for forming a FET with low flicker noise and low RTN is provided. While the flowchart 1700 of FIG. 17 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1702, an isolation structure is formed in a semiconductor substrate, where an inner perimeter of the isolation structure demarcates a device region of the semiconductor substrate. FIGS. 7A-7D illustrate various views of some embodiments corresponding to act 1702.

At act 1704, a well is formed in the device region. FIGS. 8A-8D illustrate various views of some embodiments corresponding to act 1704.

At act 1706, a gate is formed over the device region and within the inner perimeter of the isolation structure, where the gate comprises a gate electrode disposed on a gate dielectric. FIGS. 9A-9D illustrate various views of some embodiments corresponding to act 1706.

At act 1708, a pair of lightly-doped source/drain extensions are formed in the device region and on opposite sides of the gate. FIGS. 10A-10D illustrate various views of some embodiments corresponding to act 1708.

At act 1710, a sidewall spacer is formed over the device region and along sides of the gate. FIGS. 11A-11D illustrate various views of some embodiments corresponding to act 1710.

At act 1712, a pair of well pickup regions are formed in the device region. FIGS. 12A-12D illustrate various views of some embodiments corresponding to act 1712.

At act 1714, a first doped region and a second doped region are formed in the gate electrode. FIGS. 12A-12D illustrate various views of some embodiments corresponding to act 1714.

At act 1716, a first source/drain region and a second source/drain region are formed in the device region and on the opposite sides of the gate. FIGS. 13A-13D illustrate various views of some embodiments corresponding to act 1716.

At act 1718, a third doped region is formed in the gate electrode. FIGS. 13A-13D illustrate various views of some embodiments corresponding to act 1718.

At act 1720, a plurality of silicide blocking structures are formed partially covering the device region, the gate, and the isolation structure. FIGS. 14A-14D illustrate various views of some embodiments corresponding to act 1720.

At act 1722, silicide layers are formed on/in the semiconductor substrate and the gate electrode. FIGS. 15A-15D illustrate various views of some embodiments corresponding to act 1722.

At act 1724, an interconnect structure is formed over the semiconductor substrate, the gate, and the isolation structure. FIGS. 16A-16D illustrate various views of some embodiments corresponding to act 1724.

In some embodiments, the present application provides a semiconductor device. The semiconductor device comprises an isolation structure disposed in a semiconductor substrate, wherein an inner perimeter of the isolation structure demarcates a device region of the semiconductor substrate. A gate is disposed over the device region, wherein an outer perimeter of the gate is disposed within the inner perimeter of the isolation structure. A first source/drain region is disposed in the device region and on a first side of the gate. A second source/drain region is disposed in the device region and on a second side of the gate opposite the first side. A silicide blocking structure partially covers the gate, partially covers the first source/drain region, and partially covers the isolation structure, wherein a first sidewall of the silicide blocking structure is disposed between first opposite sidewalls of the gate.

In other embodiments, the present application provides a semiconductor device. The semiconductor device comprises an isolation structure disposed in a semiconductor substrate, wherein an inner perimeter of the isolation structure defines sides of a device region of the semiconductor substrate. A first source/drain region and a second source/drain region are disposed in the device region and spaced apart in a first lateral direction. A gate is disposed over the device region and between the first source/drain region and the second source/drain region, wherein an outer perimeter of the gate is disposed within the inner perimeter of the isolation structure. A first silicide blocking structure covers a first portion of the gate, a first portion of the first source/drain region, and a first portion of the isolation structure. A second silicide blocking structure covers a second portion of the gate, a second portion of the first source/drain region, and a second portion of the isolation structure, wherein the second silicide blocking structure is spaced from the first silicide blocking structure in a second lateral direction that is perpendicular to the first lateral direction.

In yet other embodiments, the present application provides a method for forming a semiconductor device. The method comprises forming an isolation structure in a semiconductor substrate, wherein an inner perimeter of the isolation structure demarcates a device region of the semiconductor substrate. A gate is formed over the device region and within the inner perimeter of the isolation structure. A first source/drain region and a second source/drain region are formed in the device region and on first opposite sides of the gate, wherein the first opposite sides of the gate are spaced apart in a first lateral direction. A first silicide blocking structure is formed partially covering the first source/drain region, partially covering the gate, and partially covering the isolation structure. A second silicide blocking structure spaced from the first silicide blocking structure in a second lateral direction that is perpendicular to the first lateral direction is formed, wherein the second silicide blocking structure partially covers the first source/drain region, partially covers the gate, and partially covers the isolation structure. A silicide process is performed to form a first silicide layer on the first source/drain region, wherein the first silicide layer is disposed between the first silicide blocking structure and the second silicide blocking structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
an isolation structure in a semiconductor substrate and demarcating a device region of the semiconductor substrate;
a first source/drain region in the device region;

a second source/drain region in the device region and spaced from the first source/drain region in a direction; and a gate overlying the device region and between and bordering the first source/drain region and the second source/drain region, wherein the gate has a maximum width less than a maximum width of the first source/drain region, wherein the maximum width of the gate extends laterally transverse to the direction, and wherein the maximum width of the first source/drain region extends laterally transverse to the direction from a first sidewall of the isolation structure to a second sidewall of the isolation structure that faces the first sidewall of the isolation structure.

2. The semiconductor device according to claim 1, wherein the maximum width of the first source/drain region is the same as a maximum width of the device region.

3. The semiconductor device according to claim 1, further comprising:
a silicide layer atop the first source/drain region, wherein a maximum width of the silicide layer is less than the maximum width of the gate.

4. The semiconductor device according to claim 1, further comprising:
a silicide layer atop the gate, wherein a maximum width of the silicide layer is less than the maximum width of the gate.

5. The semiconductor device according to claim 1, further comprising:
a silicide layer atop the gate and having a cross-shaped top layout.

6. The semiconductor device according to claim 1, further comprising:
four silicide blocking structures each overlying the isolation structure and a different corner of the gate.

7. The semiconductor device according to claim 1, wherein the maximum width of the gate and the maximum width of the first source/drain region extend laterally orthogonal to the direction.

8. A semiconductor device, comprising:
an isolation structure in a semiconductor substrate and demarcating a device region of the semiconductor substrate;
a first source/drain region and a second source/drain region spaced from each other in a first direction and in the device region, and further extending from a first sidewall of the isolation structure to a second sidewall of the isolation structure in a second direction transverse to the first direction;
a silicide layer atop the first source/drain region and spaced from the first and second sidewalls of the isolation structure;
a gate overlying the device region, wherein the gate is between and borders the first and second source/drain regions and is between and spaced from the first and second sidewalls of the isolation structure when viewed top down.

9. The semiconductor device according to claim 8, further comprising an additional silicide layer atop the second source/drain region and spaced from the first and second sidewalls of the isolation structure.

10. The semiconductor device according to claim 8, further comprising:

an additional silicide layer directly between the gate and the first sidewall of the isolation structure when viewed top down, wherein the additional silicide layer is spaced from the silicide layer.

11. The semiconductor device according to claim 8, further comprising:
a contact via having a bottom surface recessed relative to a top surface of the gate and directly between the first sidewall of the isolation structure and the gate when viewed top down.

12. The semiconductor device according to claim 8, wherein the isolation structure has a third sidewall directly contacting the first source/drain region and extending from the first sidewall of the isolation structure to the second sidewall of the isolation structure.

13. The semiconductor device according to claim 8, further comprising:
a silicide blocking structure directly between the gate and the first sidewall of the isolation structure when viewed top down.

14. The semiconductor device according to claim 8, wherein the isolation structure comprises a shallow trench isolation (STI) structure.

15. A semiconductor device, comprising:
an isolation structure in a semiconductor substrate and demarcating a device region of the semiconductor substrate;
a first source/drain region in the device region;
a second source/drain region in the device region and spaced from the first source/drain region;
a gate overlying the device region and between and bordering the first source/drain region and the second source/drain region; and
a first pickup region in the device region, wherein the first pickup region is between and borders the first and second source/drain regions and is between and borders the isolation structure and the gate.

16. The semiconductor device according to claim 15, wherein the first pickup region has a first doping type, and wherein the first and second source/drain regions have a second doping type opposite the first doping type.

17. The semiconductor device according to claim 15, further comprising:
a second pickup region in the device region, wherein the second pickup region is on an opposite side of the gate as the first pickup region, and wherein the second pickup region is between and borders the first and second source/drain regions and is between and borders the isolation structure and the gate.

18. The semiconductor device according to claim 15, wherein the gate comprises a gate dielectric layer and a gate electrode overlying the gate dielectric layer, and wherein the gate dielectric layer is spaced from the isolation structure.

19. The semiconductor device according to claim 15, wherein the gate comprises doped polysilicon, wherein corner portions of the gate at corners of the gate when viewed top down have a first doping type, and wherein a center portion of the gate at a center of the gate when viewed top down have a second doping type opposite the first doping type.

20. The semiconductor device according to claim 19, wherein the center portion has a cross shape when viewed top down.

* * * * *